(12) United States Patent
Kim et al.

(10) Patent No.: US 11,764,268 B2
(45) Date of Patent: Sep. 19, 2023

(54) SEMICONDUCTOR DEVICES AND METHOD OF MANUFACTURING THE SAME

(71) Applicant: Samsung Electronics Co., Ltd., Suwon-si (KR)

(72) Inventors: Sunggil Kim, Yongin-si (KR); Kyengmun Kang, Suwon-si (KR); Juyon Suh, Seoul (KR); Hyeeun Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/749,719

(22) Filed: May 20, 2022

(65) Prior Publication Data

US 2022/0278201 A1   Sep. 1, 2022

Related U.S. Application Data

(63) Continuation of application No. 17/085,467, filed on Oct. 30, 2020, now Pat. No. 11,342,415.

(30) Foreign Application Priority Data

Apr. 1, 2020  (KR) .................. 10-2020-0039627

(51) Int. Cl.
*H01L 29/10* (2006.01)
*H01L 25/07* (2006.01)
(Continued)

(52) U.S. Cl.
CPC .......... *H01L 29/1037* (2013.01); *H01L 24/08* (2013.01); *H01L 25/074* (2013.01);
(Continued)

(58) Field of Classification Search
CPC .............. H01L 29/1037; H01L 25/074; H01L 2224/08146; H01L 24/08; H10B 41/27; H10B 43/27
(Continued)

(56) References Cited

U.S. PATENT DOCUMENTS 9,673,291 B2  6/2017  Fukuzumi
9,698,153 B2  7/2017  Liu et al.
(Continued)

*Primary Examiner* — Didarul A Mazumder
(74) *Attorney, Agent, or Firm* — Harness, Dickey & Pierce, P.L.C.

(57) ABSTRACT

A semiconductor device, includes: gate electrodes spaced apart from each other and on a substrate; channel structures penetrating the gate electrodes, each of channel structures including a channel layer, a gate dielectric layer between the channel layer and the gate electrodes, a channel insulating layer filling between the channel layers, a channel pad on the channel insulating layer; and separation regions penetrating the gate electrodes, and spaced apart from each other, wherein the gate dielectric layer extends upwardly, further than the channel layer upwardly such that a portion of an inner side surface of the gate dielectric layer contacts the channel pad, the channel pad includes a lower pad on an upper end of the channel layer and the inner side surface of the gate dielectric layer, and having a first recess between the inner side surfaces of the gate dielectric layer; and an upper pad having a first portion in the first recess and a second portion extending from the first portion in a direction, parallel to an upper surface of the substrate on the first portion.

20 Claims, 35 Drawing Sheets

(51) Int. Cl.
*H01L 23/00* (2006.01)
*H10B 41/27* (2023.01)
*H10B 43/27* (2023.01)

(52) U.S. Cl.
CPC .... *H01L 2224/08146* (2013.01); *H10B 41/27* (2023.02); *H10B 43/27* (2023.02)

(58) Field of Classification Search
USPC .......................................... 257/329; 438/212
See application file for complete search history.

(56) References Cited

U.S. PATENT DOCUMENTS

| | | |
|---|---|---|
| 9,728,551 B1 | 8/2017 | Lu et al. |
| 10,090,321 B2 | 10/2018 | Nakajima |
| 10,242,994 B2 | 3/2019 | Inomata et al. |
| 10,431,590 B2 | 10/2019 | Tokuhira et al. |
| 10,475,879 B1 | 11/2019 | Pachamuthu et al. |
| 2012/0003800 A1* | 1/2012 | Lee ..................... H01L 29/7889 257/E21.645 |
| 2014/0008714 A1 | 1/2014 | Makala et al. |
| 2015/0155296 A1* | 6/2015 | Yoon ................... H01L 29/6656 257/324 |
| 2017/0345843 A1* | 11/2017 | Lee ....................... H10B 43/40 |
| 2019/0198522 A1 | 6/2019 | Takekida |
| 2019/0287997 A1 | 9/2019 | Komiya et al. |
| 2019/0296043 A1 | 9/2019 | Okumura |

\* cited by examiner

US 11,764,268 B2

SEMICONDUCTOR DEVICES AND METHOD OF MANUFACTURING THE SAME

CROSS-REFERENCE TO RELATED APPLICATION

This application is a continuation of U.S. patent application Ser. No. 17/085,467 filed on Oct. 30, 2020, which claims benefit of priority to Korean Patent Application No. 10-2020-0039627 filed on Apr. 1, 2020 in the Korean Intellectual Property Office, the disclosure of each of which is incorporated herein by reference in its entirety.

BACKGROUND

The present inventive concepts relate to a semiconductor device, and a method of manufacturing the same.

A semiconductor device requires high-capacity data processing while a volume thereof is reduced. Accordingly, it is necessary to increase a degree of integration of such a semiconductor device. As one of the methods for improving the degree of integration of the semiconductor device, a semiconductor device having a vertical transistor structure, instead of a conventional coplanar transistor structure, has been proposed.

SUMMARY

An aspect of the present inventive concepts is to provide a semiconductor device having an improved degree of integration and electrical characteristics, and a method of manufacturing the same.

According to an aspect of the present inventive concepts, a semiconductor device includes: gate electrodes apart from each other and stacked on a substrate; channel structures penetrating through the gate electrodes, and including a channel layer, a gate dielectric layer between the channel layer and the gate electrodes, a channel insulating layer filling a space between the channel layers, and a channel pad on the channel insulating layer; and separation regions penetrating through the gate electrodes, and spaced apart from each other, wherein the gate dielectric layer extends upwardly further than the channel layer such that a portion of an inner side surface contacts the channel pad, and the channel pad may include a lower pad on an upper end of the channel layer and on the inner side surface of the gate dielectric layer, and having a first recess between the inner side surfaces of the gate dielectric layer, and an upper pad having a first portion in the first recess and a second portion extending from the first portion in a direction, parallel to an upper surface of the substrate on the first portion.

According to aspect of the present inventive concepts, a semiconductor device includes: a substrate having first and second regions; gate electrodes stacked from each other and on the substrate; a channel structure penetrating through the gate electrodes in the first region, and having a lower channel structure, an upper channel structure, and a connection structure connecting the upper and lower channel structures; and a dummy channel structure penetrating through at least a portion of the gate electrodes in the second region, and including a lower semiconductor pattern having a recess and an upper semiconductor pattern in the recess of the lower semiconductor pattern and including a different material from the lower semiconductor pattern, wherein the connection structure may have a third width, greater than a first width at an upper end of the lower channel structure, and greater than a second width at a lower end of the upper channel structure, and in the dummy channel structure, the upper semiconductor pattern may have a fifth width, greater than a fourth width at an upper end of the lower semiconductor pattern.

According to an aspect of the present inventive concepts, a semiconductor device includes: a substrate; a first structure on the substrate; a first vertical structure penetrating through the first structure; a pad structure on the first vertical structure, and including a lower semiconductor structure having a recess recessed downwardly from an upper surface, and an upper semiconductor structure in the recess and having an extension portion having a side surface protruding from a side surface of the lower semiconductor structure on the lower semiconductor structure; a second structure on the first structure; and a second vertical structure penetrating through the second structure and connected to the pad structure.

DETAILED DESCRIPTION

Hereinafter, example embodiments of the present inventive concepts will be described with reference to the accompanying drawings.

Figure 1A:
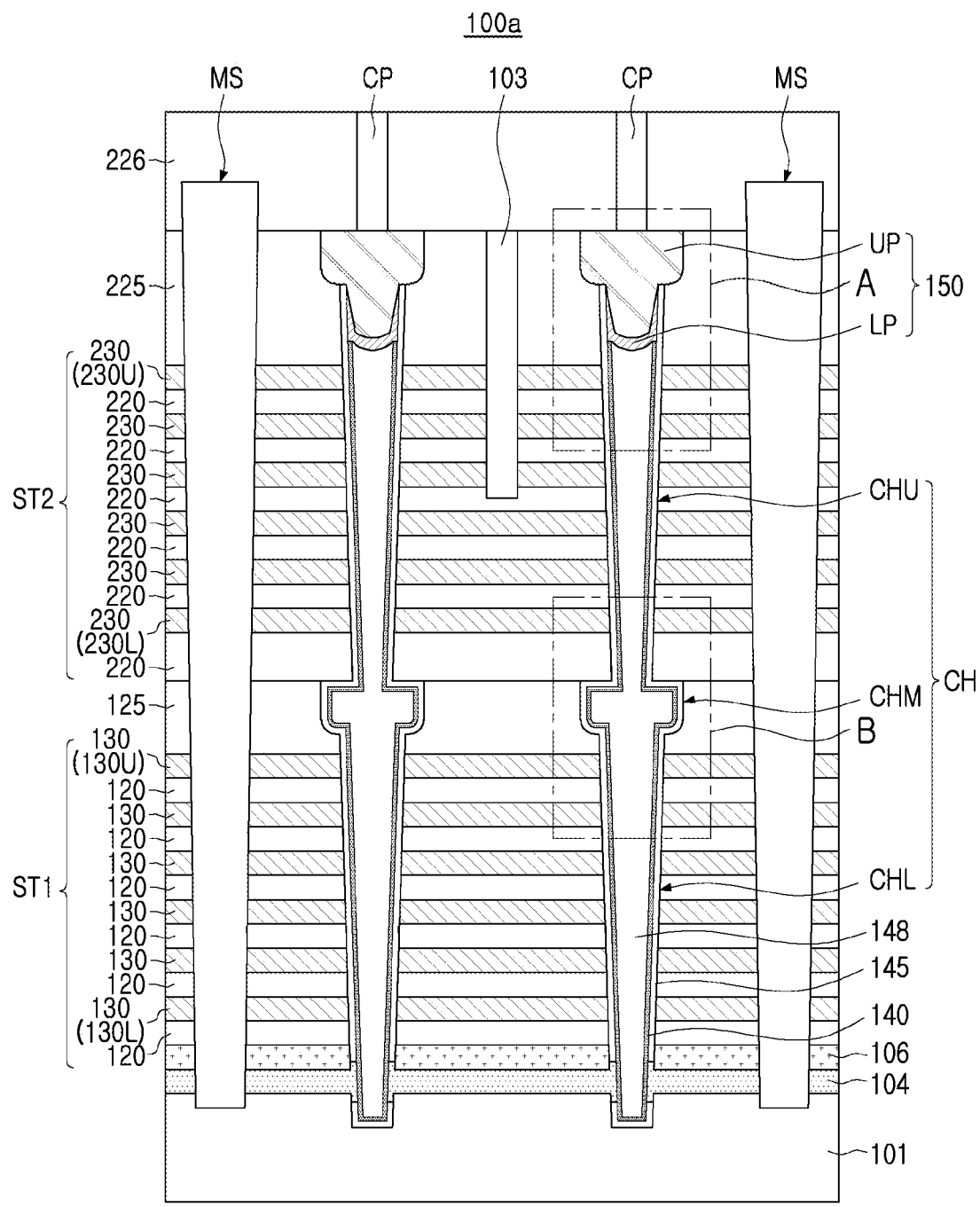
FIG. 1A is a cross-sectional view of a semiconductor device according example embodiments of the present inventive concepts.
Figure 2A:
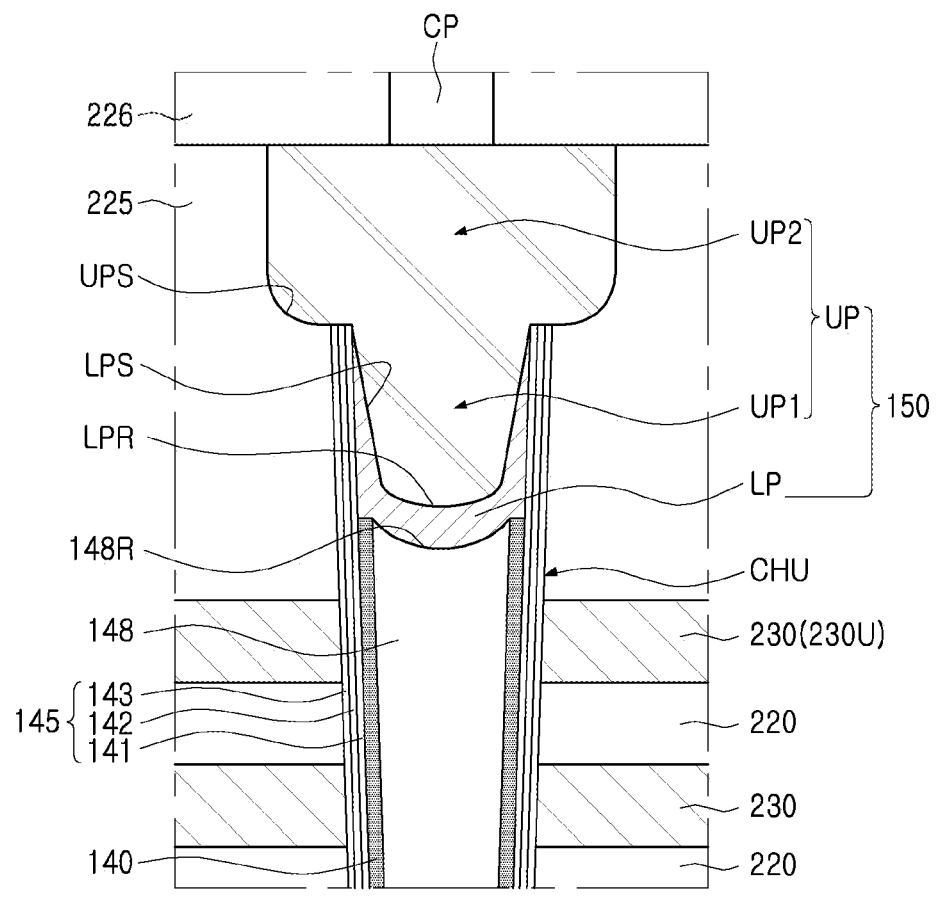
FIG. 2A is a partial enlarged cross-sectional view of an enlarged portion indicated by 'A' in FIG. 1A.
Figure 3A:
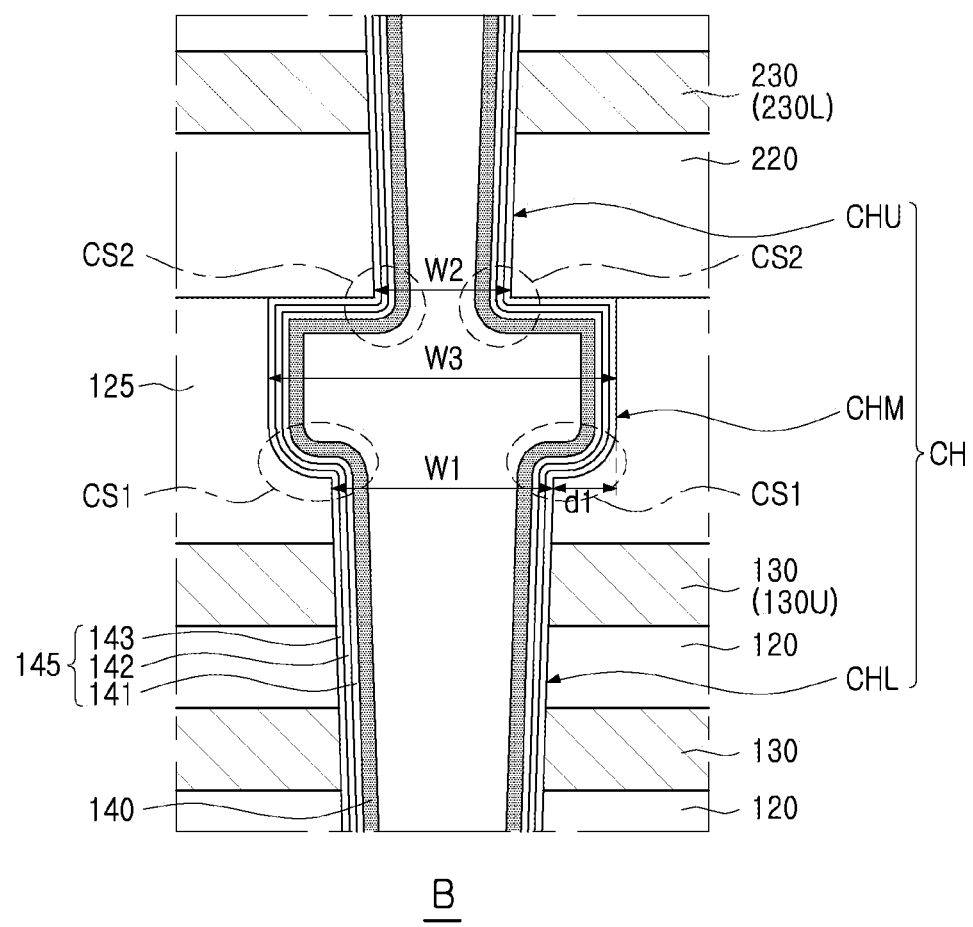
FIG. 3A is a partial enlarged cross-sectional view of an enlarged portion indicated by B' in FIG. 1A.

FIG. 1A is a cross-sectional view of a semiconductor device according example embodiments of the present inventive concepts. FIG. 2A is a partial enlarged cross-sectional view of an enlarged portion indicated by 'A' in FIG. 1A. FIG. 3A is a partial enlarged cross-sectional view of an enlarged portion indicated by 'B' in FIG. 1A.

Referring to FIGS. 1A, 2A, and 3A, a semiconductor device 100 according to some example embodiments may include a substrate 101, a first stack structure ST1 and/or a second stack structure ST2 stacked on the substrate 101, channel structures CH disposed to pass through the first and second stack structures ST1 and ST2, and a separation region MS passing through the first and second stack structures ST1and ST2 and extending in one direction. The channel structure CH may include a channel layer 140, a gate dielectric layer 145, a channel insulating layer 148, and/or a channel pad 150. The semiconductor device 100 may further include first and second horizontal conductive layers 104 and 106 disposed between the substrate 101 and the first stack structure ST1, an intermediate insulating layer 125 between the first and second stack structures ST1 and ST2, an upper separation region 103 passing through a portion of the second stack structure ST2, first and second insulating layers 225 and 226 on the second stack structure ST2, and contact plugs CP.

The substrate 101 may include a semiconductor material, such as a group IV semiconductor, a group III-V compound semiconductor, or a group II-VI oxide semiconductor. For example, the group IV semiconductor may include silicon, germanium or silicon-germanium. The substrate 101 may be provided as a bulk wafer or an epitaxial layer. The substrate 101 may include first and second regions. The first region may be a region in which a gate, a channel, and the like, serving as a memory cells of the semiconductor device 100 are disposed. The second region may be a region in which a dummy channel is formed in the semiconductor device 100. The second region may be, for example, a region in which a dummy channel, serving as an alignment key, is formed during a manufacturing process of the semiconductor device, but is not limited thereto.

The first stack structure ST1 may include first interlayer insulating layers 120 and first gate electrodes 130, alternately stacked on the substrate 101. The second stack structure ST2 may include second interlayer insulating layers 220 and second gate electrodes 230, alternately stacked on the first stack structure ST1

The first and second gate electrodes 130 and 230 may be stacked to be spaced apart from each other, perpendicular on the substrate 101, respectively. The first and second gate electrodes 130 and 230 may extend to different lengths on at least one region of the substrate 101. The first and second gate electrodes 130 and 230 may be referred to as first and second gate stacked groups, respectively.

A first lowermost gate electrode 130L disposed in a lowermost portion of the first gate electrodes 130 may be a gate electrode of a ground selection transistor. A second uppermost gate electrode 230U disposed in an uppermost portion of the second gate electrodes 230 may be a gate electrode of a string selection transistor. According to example embodiments, the string selection gate electrode and the ground selection gate electrode may be one or two or more, respectively.

The first and second gate electrodes 130 and 230 between the first lowermost gate electrode 130L and the second highest gate electrode 230U may be memory cell gate electrodes constituting a plurality of memory cells. The number of first and second gate electrodes 130 and 230 constituting memory cells may be determined according to the capacity of the semiconductor device 100.

The first and second gate electrodes 130 and 230 may be disposed to be separated in a predetermined or alternatively, desired unit by separation regions MS extending in one direction. The first and second gate electrodes 130 and 230 between the pair of separation regions MS may form one memory block, but a scope of the memory block is not limited thereto.

Some of the first and second gate electrodes 130 and 230 may be, for example, gate electrodes 130 and 230, adjacent to the string selection gate electrode and the ground selection gate electrode, may be dummy gate electrodes. The first lowermost gate electrode 130L positioned in an uppermost portion of the first gate electrodes 130 and the second uppermost gate electrode 230U positioned in a lowermost portion of the second gate electrodes 230 may also be dummy gate electrodes.

The first and second gate electrodes 130 and 230 may include a metal material, such as tungsten W. According to example embodiments, the first and second gate electrodes 130 and 230 may include polycrystalline silicon or a metal silicide material.

The first and second gate electrodes 130 and 230 may include an internal gate conductive layer and a diffusion barrier surrounding the internal gate conductive layer. The diffusion barrier may include, for example, tungsten nitride (WN), tantalum nitride (TaN), titanium nitride (TiN), or a combination thereof.

The first and second interlayer insulating layers 120 and 220 may be disposed between the gate electrodes 130 and 230, respectively. Like the first and second gate electrodes 130 and 230, the first and second interlayer insulating layers 120 and 220 may be disposed to be spaced apart from each other in a direction, perpendicular to the upper surface of the substrate 101 and extend in at least one direction. The first and second interlayer insulating layers 120 and 220 may include an insulating material such as silicon oxide or silicon nitride. The second interlayer insulating layer 220 disposed in the lowermost portion of the second interlayer insulating layers 220 may have a relatively thick thickness, but is not limited thereto.

An intermediate insulating layer 125 may be disposed between the first stack structure ST1 and the second stack structure ST2. The intermediate insulating layer 125 may include the same material as the first and second interlayer insulating layers 120 and 220, for example, an insulating material such as silicon oxide or silicon nitride. In some example embodiments, the intermediate insulating layer 125 may have a thickness, greater than the thickness of each of the first and second interlayer insulating layers 120 and 220. The thickness of the intermediate insulating layer 125 may range from about 10 nm to about 100 nm.

The channel structures CH may be disposed to be spaced apart from each other while forming rows and columns on the substrate 101. The channel structures CH may be arranged to form a grid pattern or may be disposed in a zigzag form in one direction. The channel structures CH may extend vertically on the substrate 101. The channel structures CH may have a columnar shape, and may have an inclined side surface that becomes narrower towards the substrate 101 according to an aspect ratio.

A channel layer 140 may be disposed in the channel structures CH. The channel layer 140 in the channel structures CH may be formed in an annular shape surrounding an inner channel insulating layer 148, but according to some example embodiments, the channel layer 140 may have a columnar shape such as a cylindrical shape or prismatic shape without the channel insulating layer 148. The channel insulating layer 148 may fill between the channel layers 140. The channel layer 140 may include a semiconductor material such as polycrystalline silicon or monocrystalline silicon, and the semiconductor material may be an undoped material or a material containing p-type or n-type impurities. A recess 148R recessed from the upper end to the lower portion may be formed an upper surface of the channel insulating layer 148.

The gate dielectric layer 145 may be disposed between the first and second gate electrodes 130 and 230 and the channel layer 140. The gate dielectric layer 145 may extend upwardly, further than the channel layer 140 so that a portion of the inner side surface may contact the channel pad 150. The gate dielectric layer 145 may include a tunneling layer 141, an information storage layer 142, and/or a blocking layer 143, sequentially stacked from the channel layer 140. The tunneling layer 141 may tunnel charges to the information storage layer 142, and may include, for example, silicon oxide ($SiO_2$), silicon nitride ($Si_3N_4$), silicon oxynitride (SiON), or a combination thereof. The information storage layer 142 may be a charge trap layer or a floating gate conductive layer. The blocking layer 143 may include silicon oxide ($SiO_2$), silicon nitride ($Si_3N_4$), silicon oxynitride (SiON), high-k dielectric materials, or a combination thereof.

In the channel structures CH, channel pads 150 may be disposed above the channel layer 140. The channel pads 150 may include a lower pad LP and an upper pad UP, as illustrated in FIG. 2A.

The lower pad LP may be disposed on an upper end of the channel layer 140 and an inner side surface of the gate dielectric layer 145. The lower pad LP may have a first recess LPR between the inner side surfaces of the gate dielectric layer 145. The first recess LPR of the lower pad LP may have a shape recessed from the upper end of the lower pad LP to the lower portion. The side surface LPS on which the first recess LPR of the lower pad LP is formed may have a slope becoming narrower towards the substrate 101 according to an aspect ratio. The first recess LPR may have a 'U' shape or a similar shape that narrows toward the bottom. The lower pad LP may include a semiconductor material such as polycrystalline silicon or monocrystalline silicon, and the semiconductor material may be an undoped material or a material containing p-type or n-type impurities.

The upper pad UP may be disposed on the gate dielectric layer 145 and the lower pad LP. The upper pad UP may have an upper surface that is substantially coplanar with the upper surface of the first insulating layer 225. The upper pad UP may have a first portion UP1 disposed in the first recess LPR of the lower pad LP and a second portion UP2 extended from the first portion UP1 in a direction parallel to the upper surface of the substrate 101 on the first portion UP1. A width of the first portion UP1 may decrease towards the substrate 101. The second portion UP2 may have a width greater than the width at the upper end of the first portion UP1. The second portion UP2 may contact the upper end of the gate dielectric layer 145. An outer side surface UPS of the second portion UP2 may extend from the upper end of the gate dielectric layer 145 to form a curved surface. The width of the second portion UP2 may increase as it goes upwardly, but is not limited thereto. The upper pad UP may include a semiconductor material such as polycrystalline silicon or monocrystalline silicon, and the semiconductor material may be a material containing p-type or n-type impurities.

In some example embodiments, the lower pad LP and the upper pad UP may include silicon and first impurities, and the upper pad UP may further include second impurities. The first impurities and the second impurities may include different kinds of impurities. The first impurities may be impurities diffused from the upper pad UP to the lower pad LP by injecting impurities in-situ in a process of forming the upper pad UP. The first impurities may be, for example, at least one of boron (B), phosphorus (P), and arsenic (As). The second impurities may include carbon (C) and/or chlorine (Cl). In some example embodiments, the second impurities may not diffuse to the lower pad LP.

The channel structure CH may include a lower channel structure CHL, a connection structure CHM, and/or an upper channel structure CHU. The connection structure CHM may connect the lower channel structure CHL and the upper channel structure CHU.

The lower channel structure CHL may penetrate through the first stack structure ST1, and the upper channel structure CHU may penetrate through the second stack structure ST2. The connection structure CHM may be disposed between the first stack structure ST1 and the second stack structure ST2. As illustrated in FIG. 3A, the connection structure CHM may have a third width W3, greater than the first width W1, which is a maximum width of the upper end of the lower channel structure CHL, and greater than the second width W2, which is a maximum width of the lower end of the upper channel structure CHU.

The connection structure CHM, as illustrated in FIG. 3A, may have a first bent portion CS1 connecting the connection structure CHM and a second bent portion CS2 connecting the connection structure CHM and the upper channel structure CHU. An outer side surface of the first bent portion CS1 may have a convex curved surface externally on the lower channel structure CHL. An upper surface of the connection structure CHM extending from the second bent portion CS2 may be substantially coplanar with the upper surface of the intermediate insulating layer 125.

In some example embodiments, a horizontal distance between the outer side surface at the upper end of the lower channel structure CHL and the outer surface of the connection structure CHM may range from about 1 nm to about 5 nm.

A contact plug CP may be disposed on the channel structures CH. The contact plug CP may be connected to the channel pads 150. The contact plug CP may connect the channel structures CH with an upper wiring structure. The contact plug CP may be stably connected to the channel pad 150 by the upper pad UP having the extended second portion UP2.

At least a portion of the first and second horizontal conductive layers 104 and 106 may function a portion of a common source line of the semiconductor device 100, and may function as a common source line together with the substrate 101. The first horizontal conductive layer 104 may be directly connected to the channel layer 140 at a periphery of the channel layer 140 of the lower channel structure CHL. The first and second horizontal conductive layers 104 and 106 may include a semiconductor material, for example, polycrystalline silicon. In some example embodiments, at least the first horizontal conductive layer 104 may be a doped layer, and the second horizontal conductive layer 106 may be a doped layer or a layer containing impurities diffused from the first horizontal conductive layer 104. The first horizontal conductive layer 104 may be referred to as a source conductive layer.

A separation region MS may be disposed to extend in one direction. The separation region MS may be a through separation region penetrating through the entire first and second gate electrodes 130 and 230 stacked on the substrate 101 and connected to the substrate 101. The separation region MS may separate the first and second gate electrodes 130 and 230. The separation region MS may be disposed by partially recessing the upper portion of the substrate 101 or may be disposed on the substrate 101 to contact the upper surface of the substrate 101. The separation region MS may be formed of an insulating material.

An upper separation region 103 may be disposed to penetrate at least a portion of the second gate electrodes 230 including the second uppermost gate electrode 230U among second gate electrodes 230. The upper separation region 103 may be formed of an insulating material. The number of second gate electrodes 230 separated by the upper separation region 103 may be variously changed in example embodiments First and second insulating layers 225 and 226 may be disposed on the second stack structure ST2. The first and second insulating layers 225 and 226 may include an insulating material such as silicon oxide or silicon nitride.

Figure 1B:
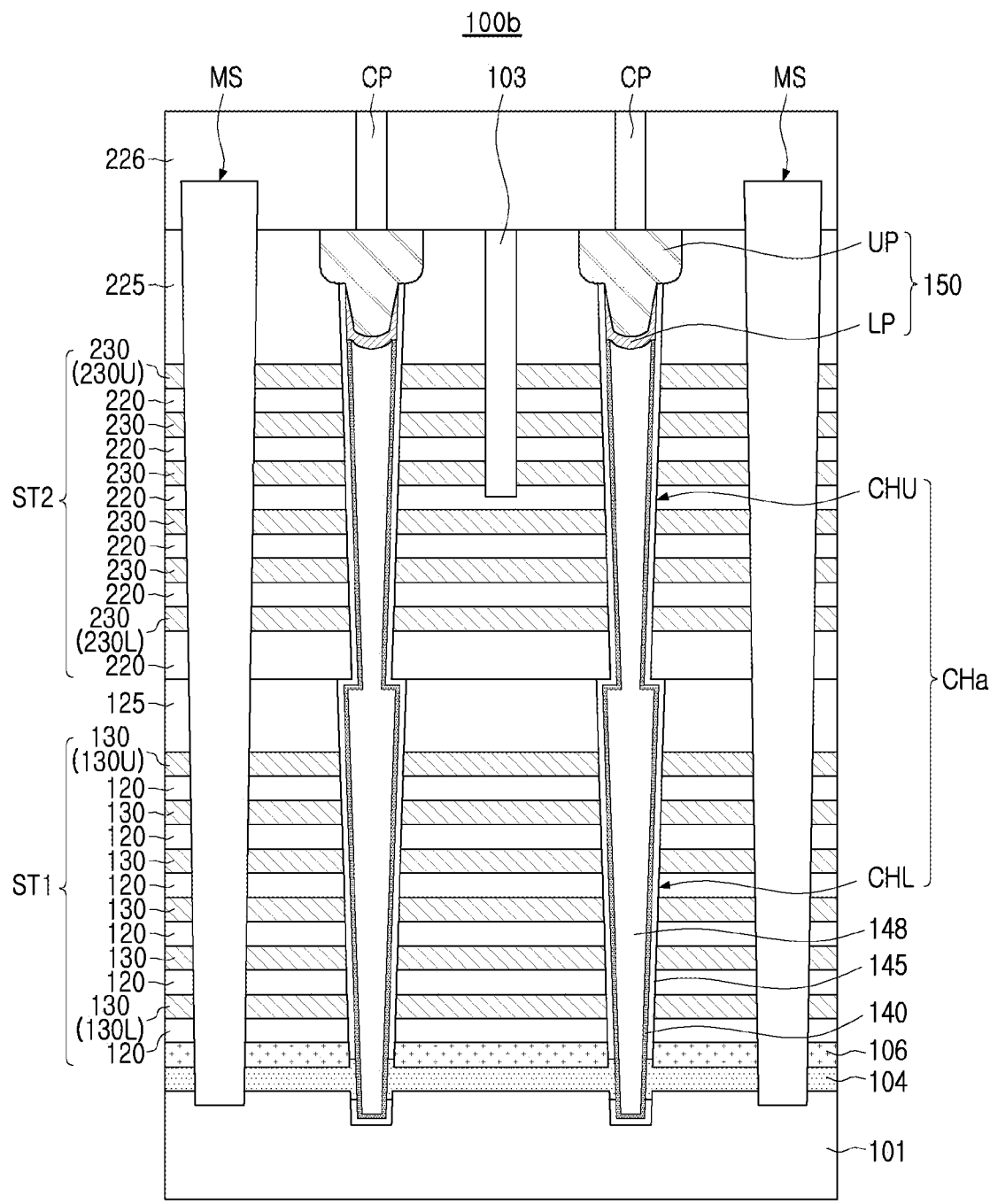
FIGS. 1B and 1C are cross-sectional views illustrating an example of a semiconductor device according to example embodiments of the present inventive concepts.
Figure 1C:
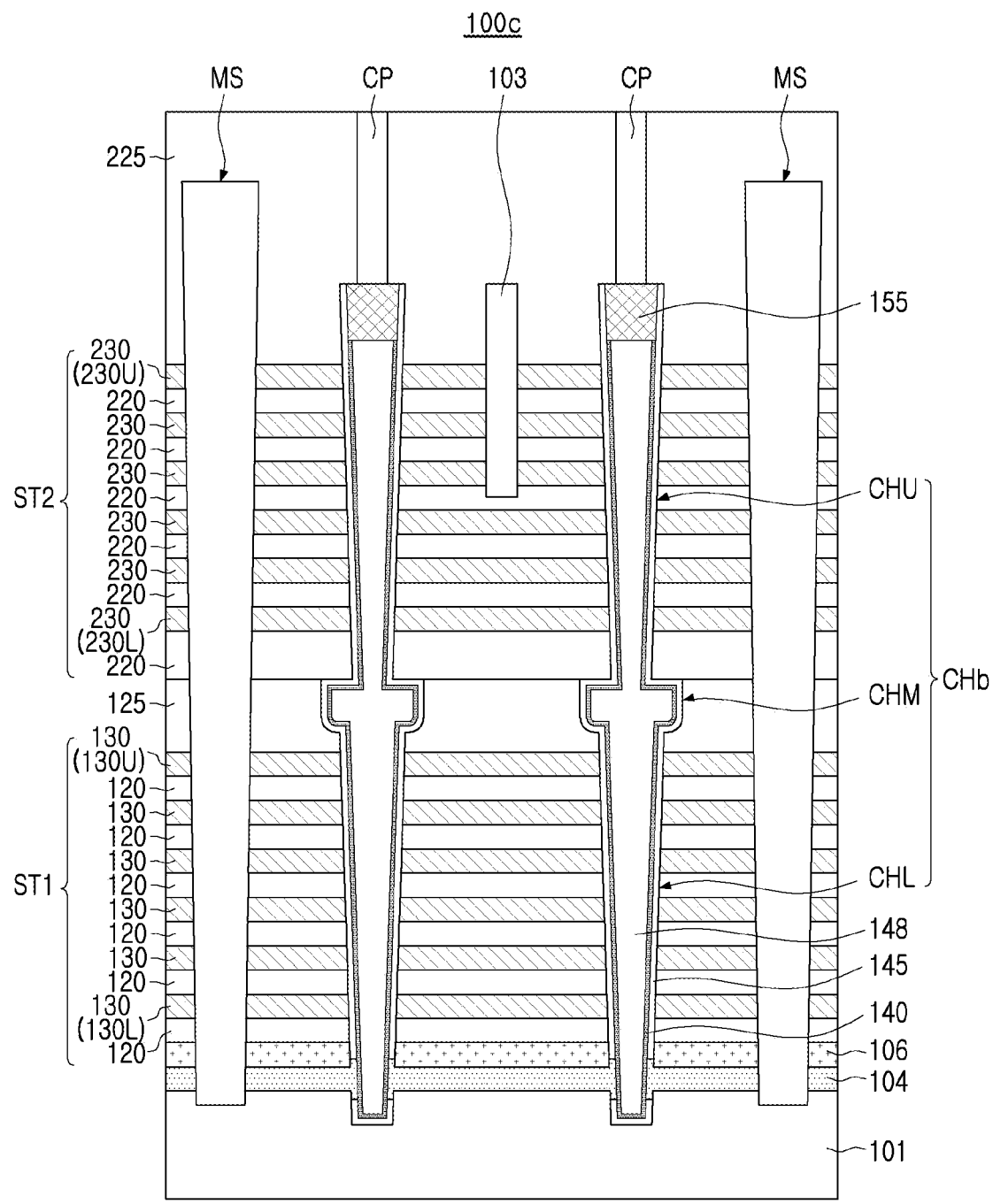

FIGS. 1B and 1C are cross-sectional views illustrating an example of a semiconductor device according to example embodiments of the present inventive concepts. In FIG. 1B, components identical to those described with reference to FIGS. 1A, 2A, and 3A will be omitted, and only modified components of the semiconductor device will be described.

Referring to FIG. 1B, in a semiconductor device 100b, a structure of the channel structure CHa may be different. The channel structure CHa may be directly connected to the lower channel structure CHL and the upper channel structure CHU. The channel structure CHa may have a bent portion due to a difference in a width in a region in which the lower channel structure CHL and the upper channel structure CHU are connected.

Referring to FIG. 1C, in a semiconductor device 100c, a structure of a channel structure CHb may be different. The channel structure CHb may not include upper and lower pads LP and UP (see FIG. 2A), and may include a buried channel pad 155 on the channel layer 140. The buried channel pad 155 may be disposed to cover the upper surface of the channel insulating layer 148 and to be electrically connected to the channel layer 140. The buried channel pad 155 may include, for example, doped polycrystalline silicon.

FIGS. 2B to 2E are partial enlarged cross-sectional views illustrating an example of a semiconductor device according to example embodiments of the present inventive concepts. FIGS. 2B to 2E illustrate a region corresponding to a portion indicated by 'A' in FIG. 1A. Referring to FIGS. 2B to 2E, other structures will be described compared to the example embodiment of FIG. 2A.

Figure 2B:
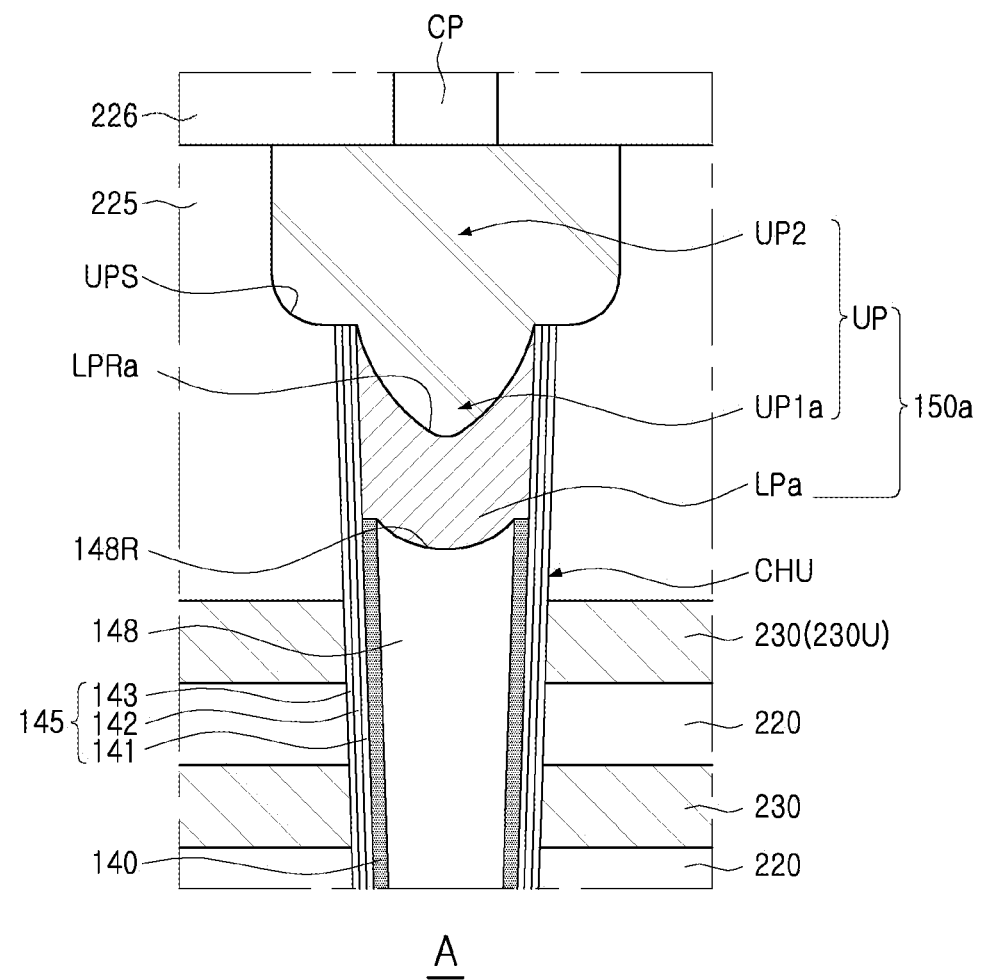
FIGS. 2B to 2E are enlarged partial cross-sectional view illustrating an example of a semiconductor device according to example embodiments of the present inventive concepts.

Referring to FIG. 2B, in a channel pad 150a, a structure of a first portion UP1a of the lower pad LPa and the upper pad UP may be different. The lowermost end of a first recess LPRa of the lower pad LPa may be disposed at a relatively high level so that the lower pad LPa has a thicker thickness. The first recess LPRa may be formed to have a substantially 'V' shape or a similar shape. The first portion UP1a may be disposed in the first recess LPRa.

Figure 2C:
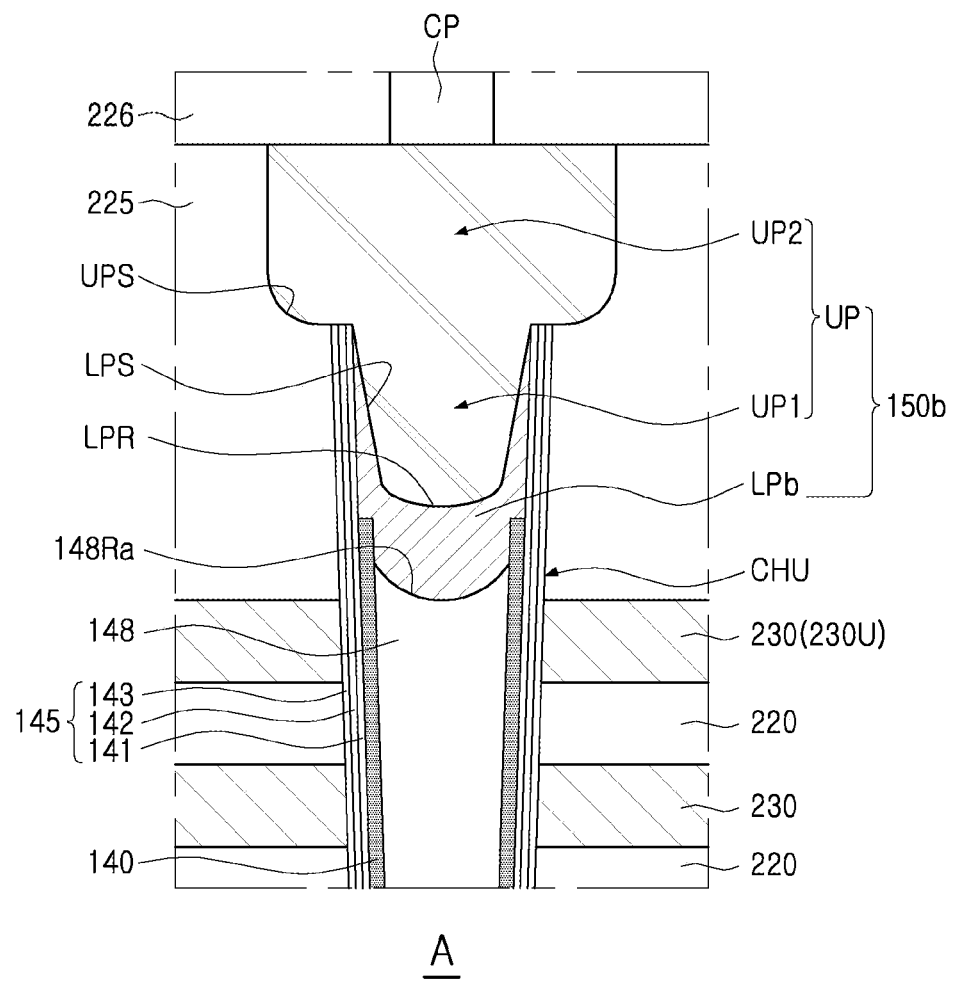

Referring to FIG. 2C, in a channel pad 150b, a structure of the lower pad LPb may be different. The lower pad LPb may extend between the inner side surfaces of the channel layer 140, and the uppermost end of the channel insulating layer 148 may be disposed below the upper end of the channel layer 140. The lowermost end of the recess 148Ra of the channel insulating layer 148 may be disposed at a relatively low level so that the lower pad LPb has a greater thickness.

Figure 2D:
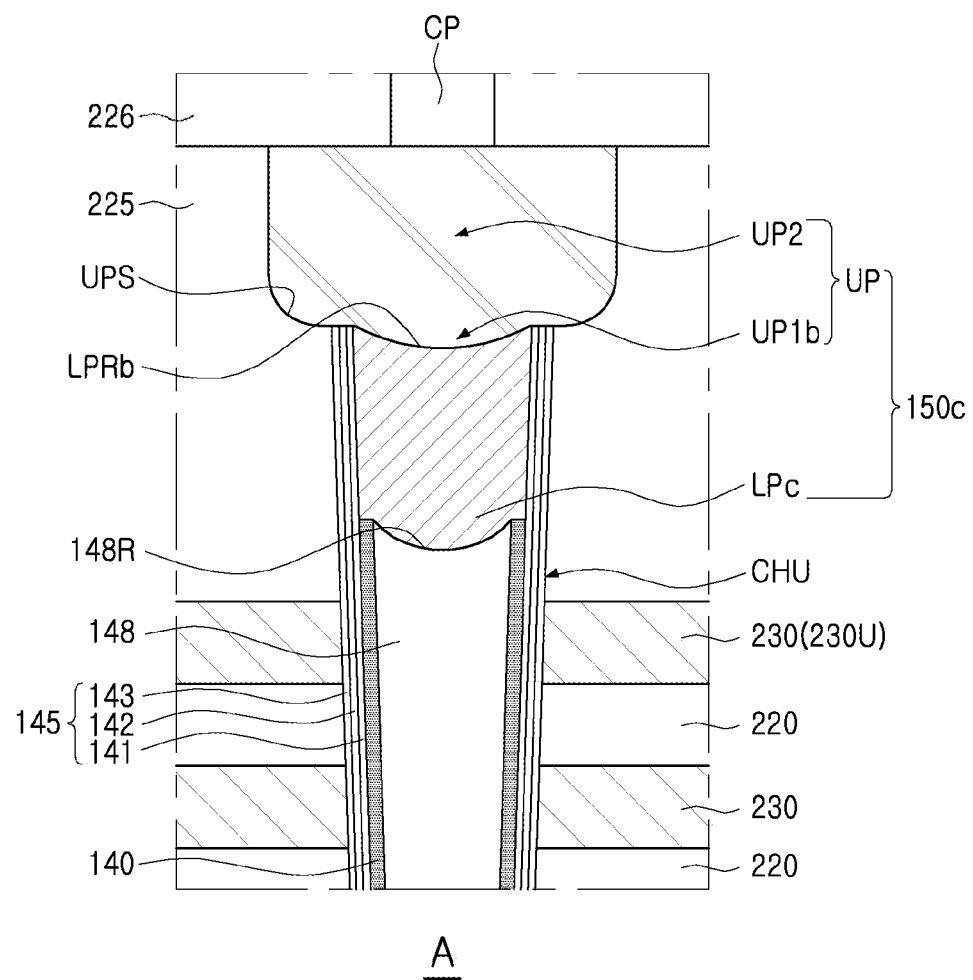

Referring to FIG. 2D, in a channel pad 150c, a structure of the first portion UP1b of the lower pad LPc and the upper pad UP may be different. The lowermost end of the first recess LPRb of the lower pad LPc may be disposed at a relatively high level, and the first portion UP1b may have a convexly rounded shape from a portion in which the second portion UP2 contacts the gate dielectric layer 145 toward the lower pad LPc. However, the upper surface of the lower pad LPc may be positioned at the same level as the upper end of the gate dielectric layer 145 according to example embodiments.

Figure 2E:
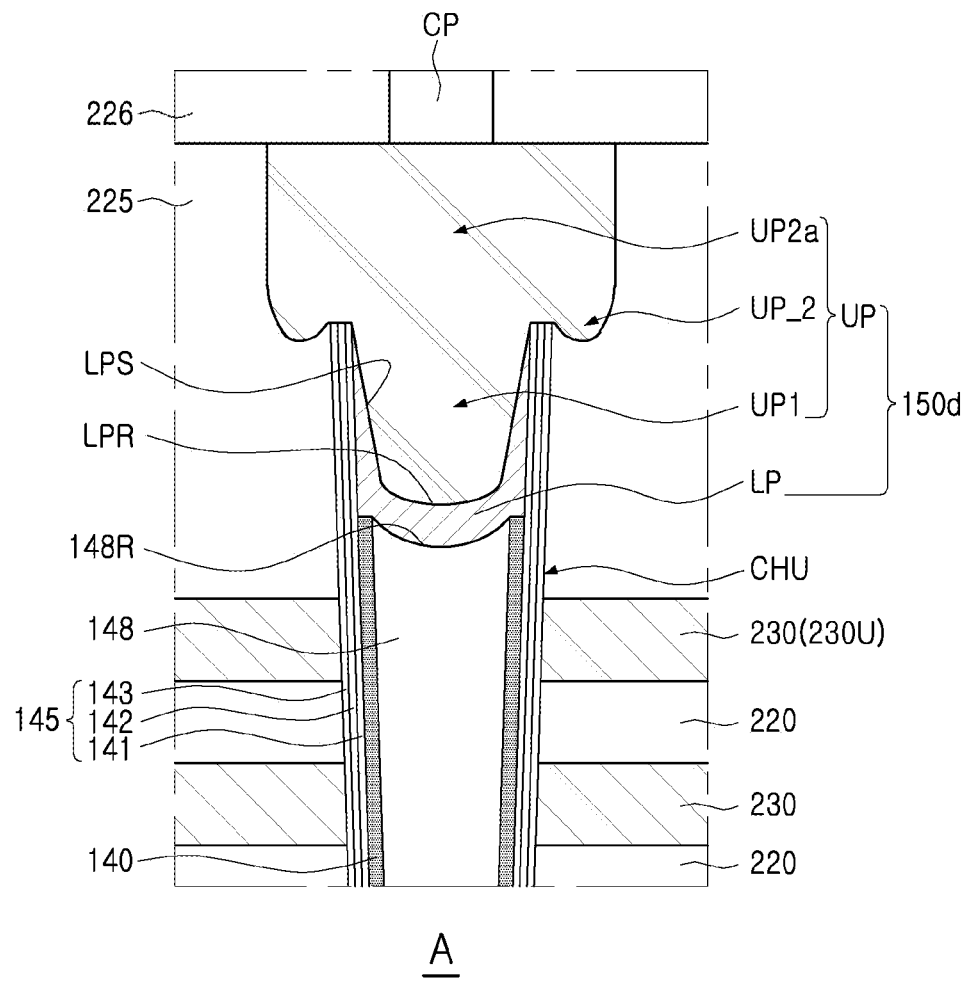

Referring to FIG. 2E, in a channel pad 150d, a structure of a second portion UP2a of the upper pad UP may be different. The second portion UP2a may contact a an upper end of the gate dielectric layer 145, and may include a second lower portion UP_2 having a convex shape downwardly from the upper end of the gate dielectric layer 145 on the outer side surface of the gate dielectric layer 145. The second lower portion UP_2 may be a portion formed by etched further downwardly than a peripheral region during the etching process of the first insulating layer 225.

Figure 3B:
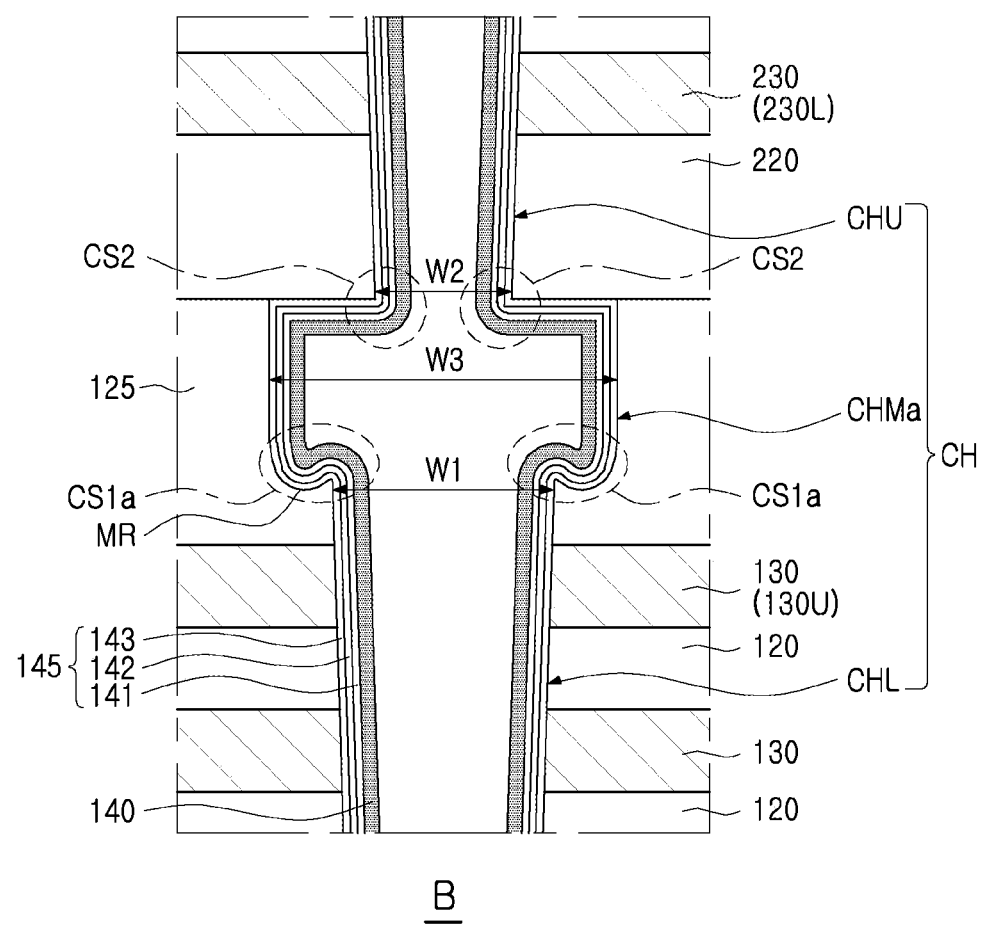
FIG. 3B is a partial enlarged cross-sectional view illustrating an example of a semiconductor device according to example embodiments of the present inventive concepts.

FIG. 3B is a partially enlarged cross-sectional view illustrating an example of a semiconductor device according to example embodiments of the present inventive concepts. FIG. 3B illustrates a region corresponding to a portion indicated by 'B' in FIG. 1A.

Referring to FIG. 3B, a structure of the connection structure CHMa of the channel structure CH may be different. The connection structure CHMa may include a first bent portion CS1a connecting the lower channel structure CHL and the connection structure CHMa. An outer side surface MR of the first bent portion CS1a may form a convex surface curved toward the substrate 101. The gate dielectric layer 145 and the channel layer 140 included in the channel structure CH may also be disposed to form a curved surface along the outer side surface MR of the first bent portion CS1a. The outer side surface MR of the first bent portion CS1a may be formed by etching further downwardly than the peripheral region during the etching process of the intermediate insulating layer 125.

Figure 3C:
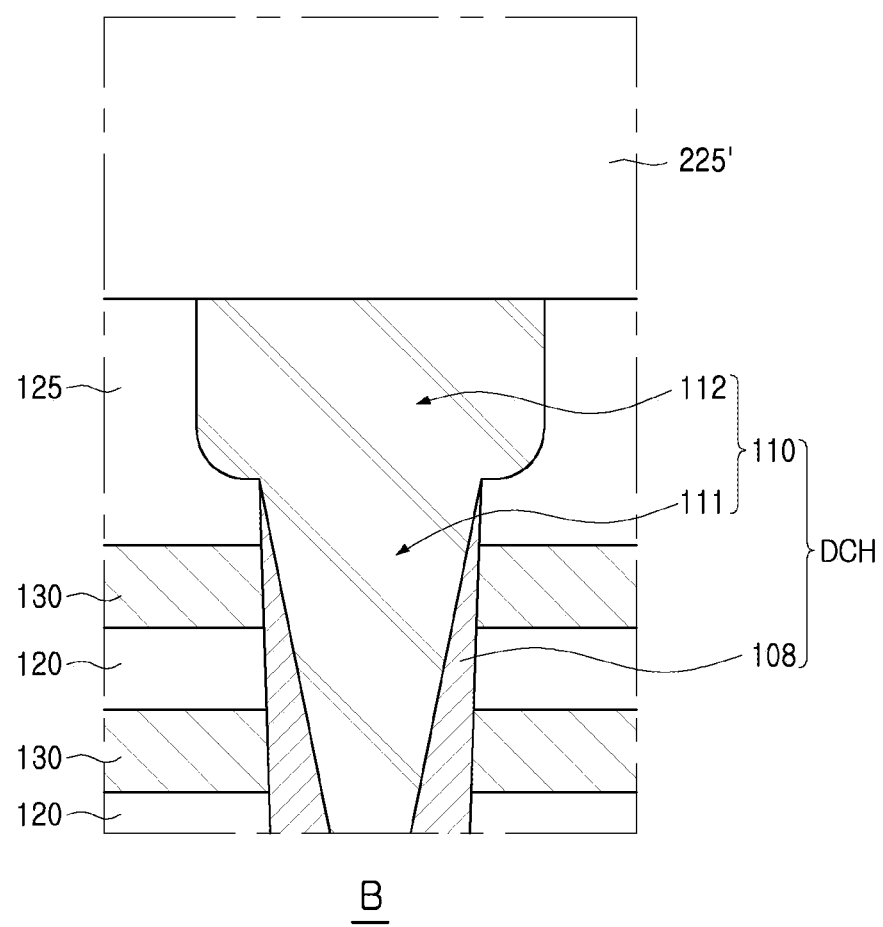
FIGS. 3C and 3D are partial enlarged cross-sectional views illustrating an example of a semiconductor device according to example embodiments of the present inventive concepts.
Figure 3D:
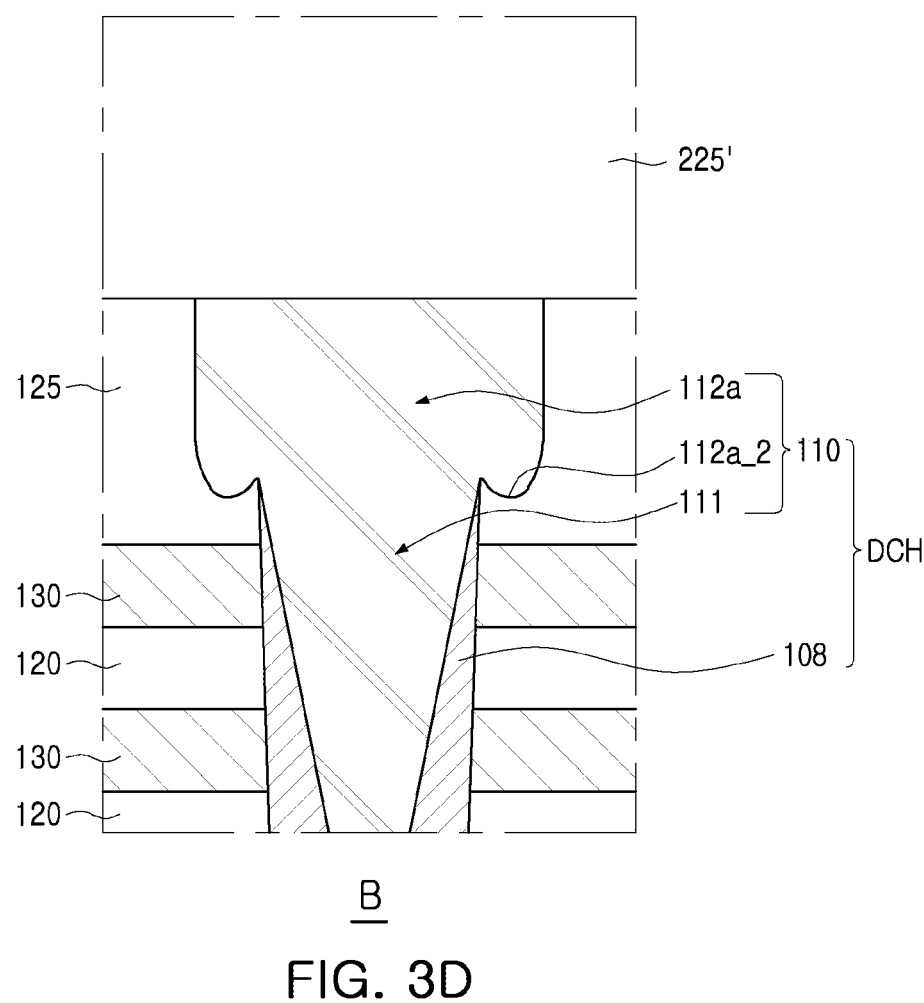

FIGS. 3C and 3D are partial enlarged cross-sectional views illustrating an example of a semiconductor device according to example embodiments of the present inventive concepts. FIGS. 3C and 3D illustrate a region corresponding to a portion indicated by 'B' in FIG. 1A.

Referring to FIG. 3C, the semiconductor device 100 may further include a dummy channel structure DCH penetrating through the first stack structure ST1 in at least one region on the substrate 101, for example, on the second region. The dummy channel structure DCH may not perform a substantial function in the semiconductor device 100. The dummy channel structure DCH may be a structure used as an alignment key during the manufacturing process of the semiconductor device. The dummy channel structure DCH may be disposed on a second region of the substrate 101 where the first and second gate electrodes 130 and 230 extend in different lengths. The dummy channel structure DCH may be disposed in at least one region on the substrate 101 in example embodiments of all semiconductor devices included in the present specification.

Figure 8A:
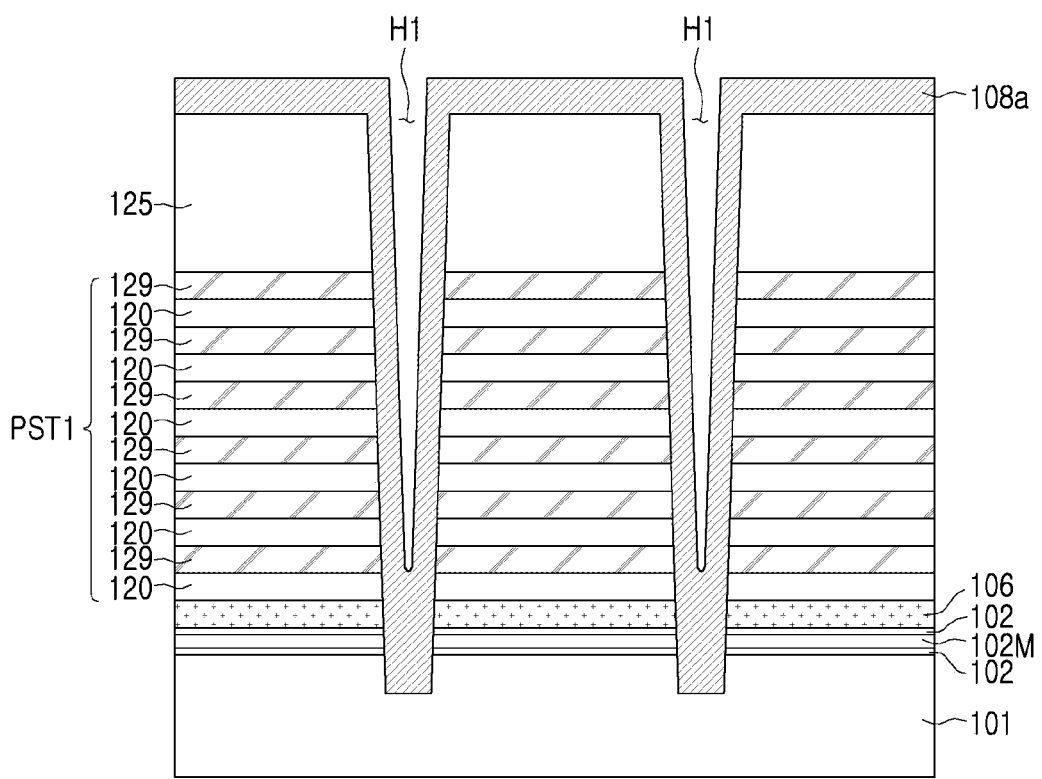
FIGS. 8A to 8L are cross-sectional views illustrating an example of a manufacturing method of a semiconductor device according to example embodiments of the present inventive concepts.
Figure 8B:
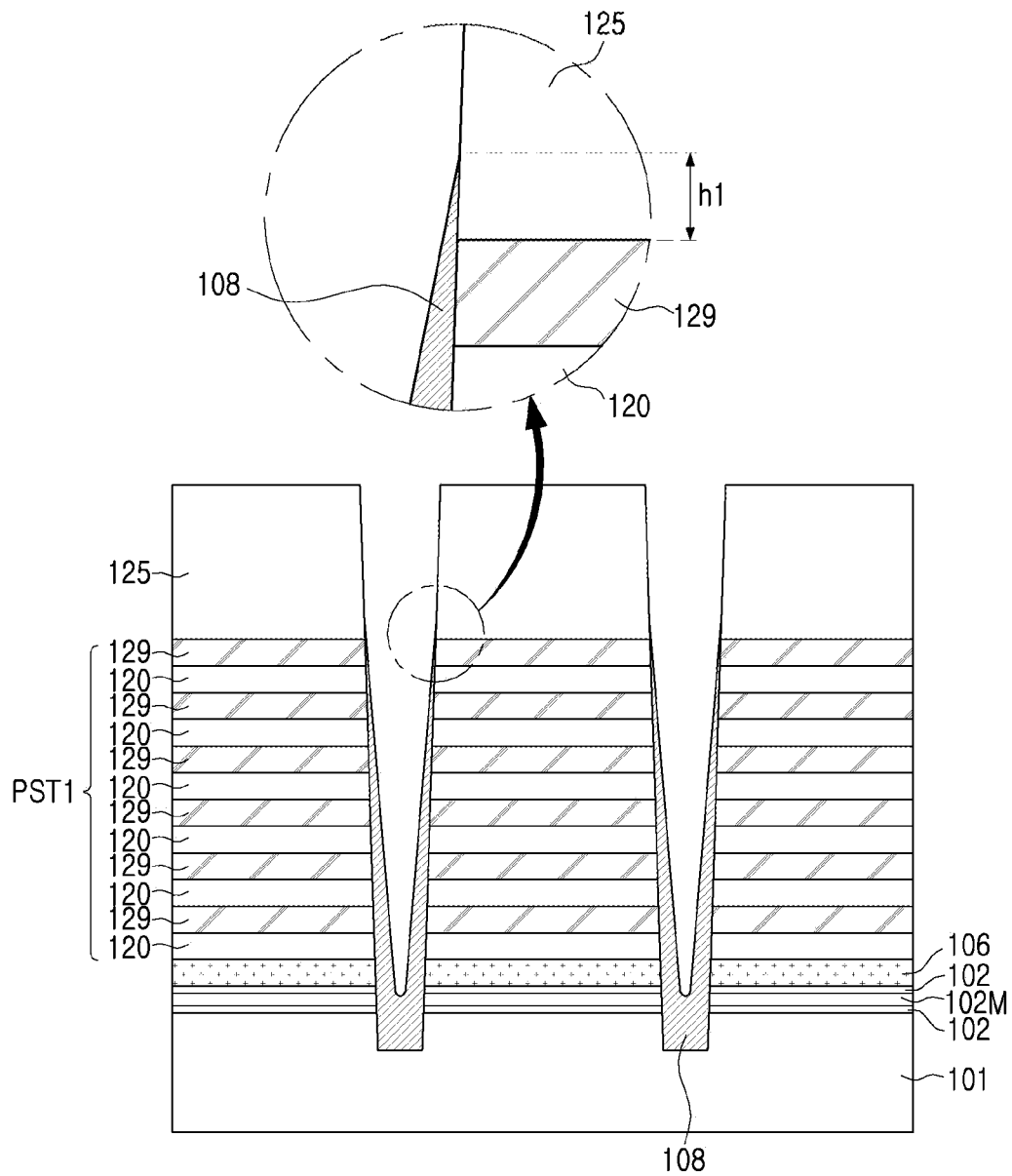
Figure 8C:
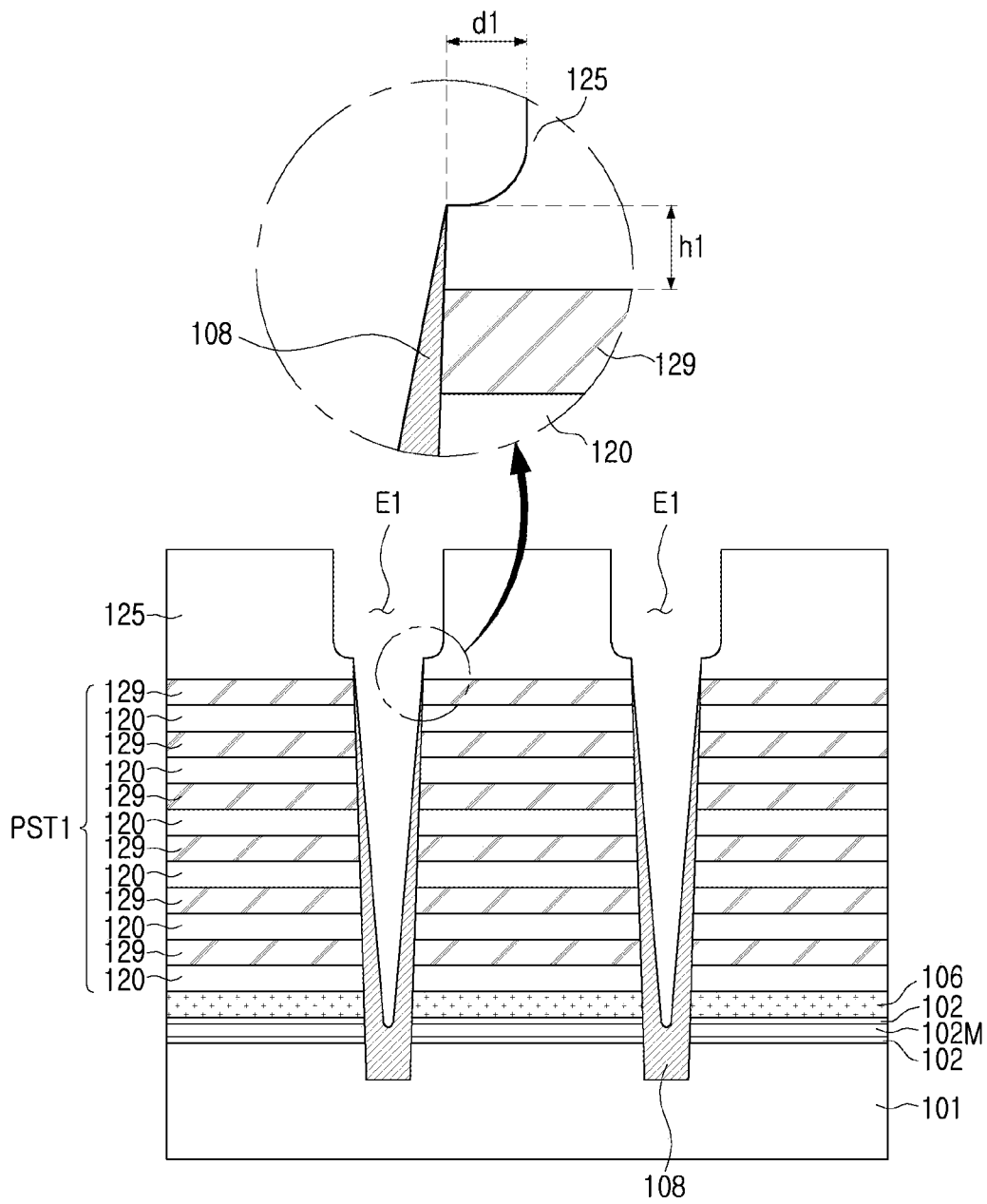
Figure 8D:
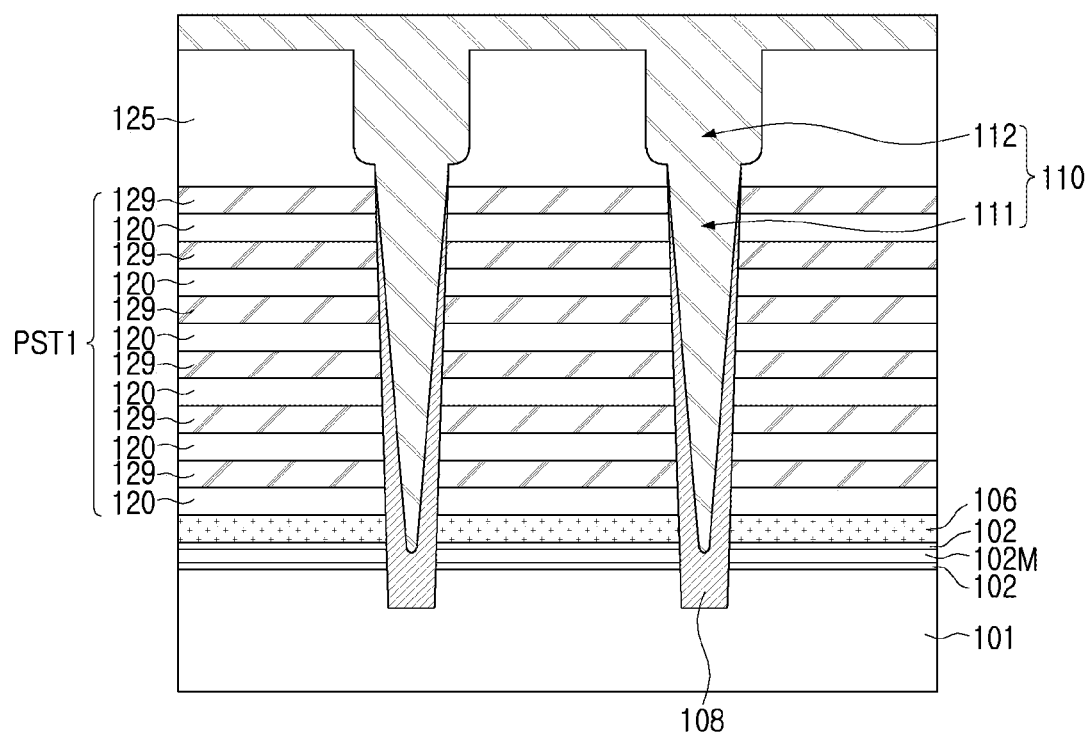
Figure 8E:
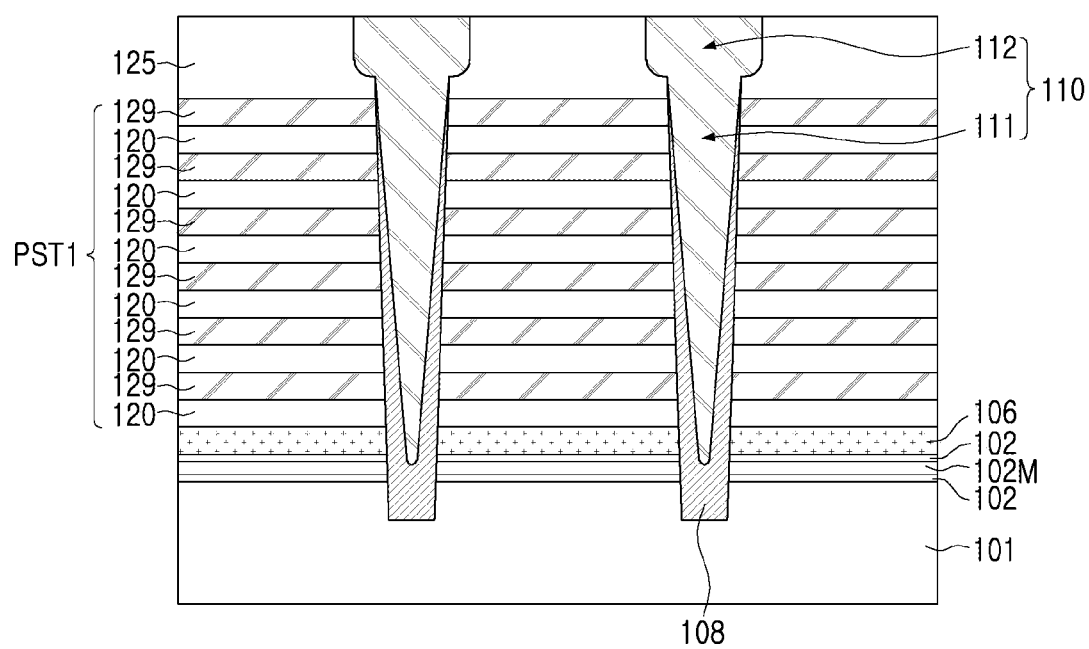
Figure 8F:
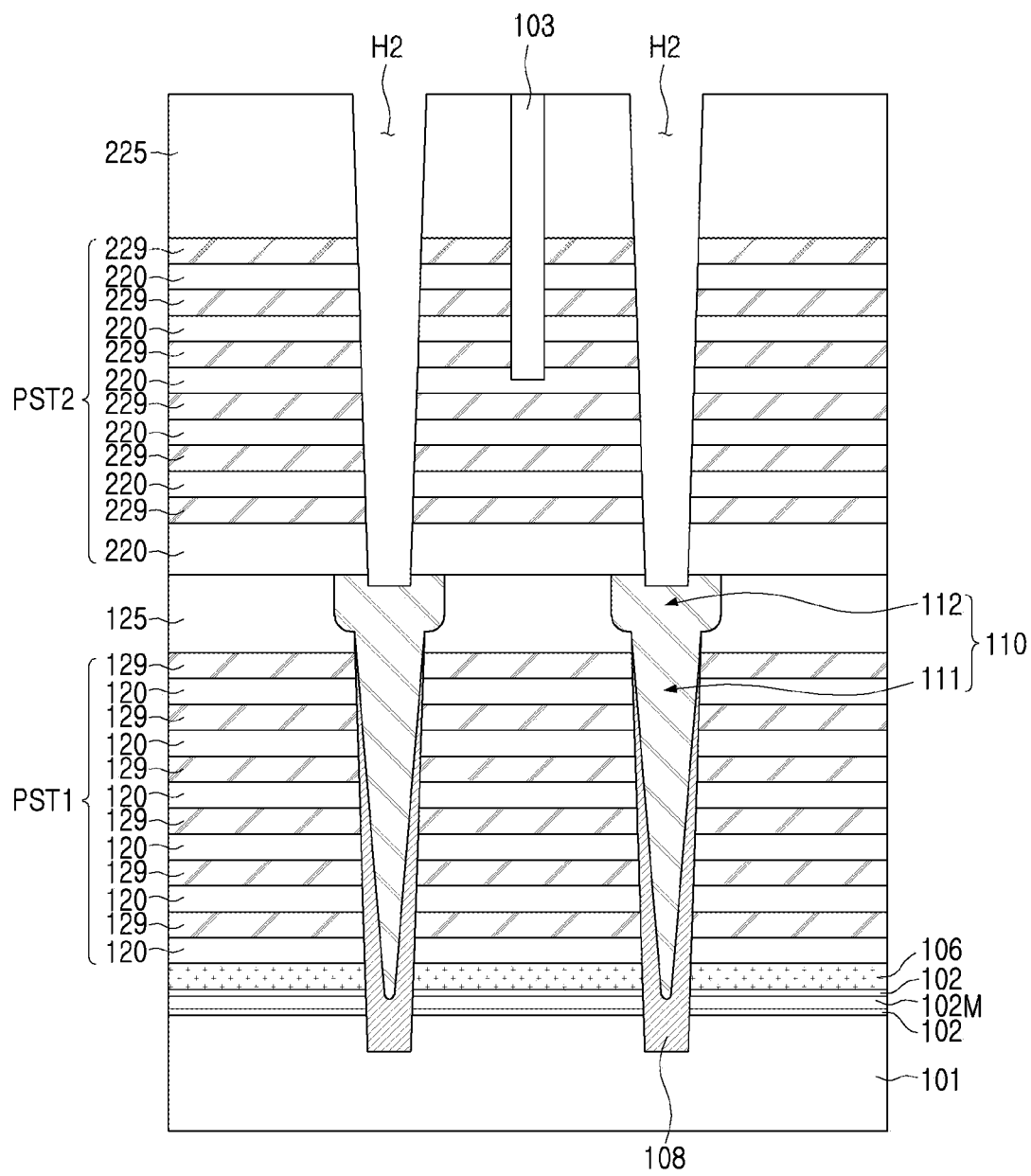
Figure 8G:
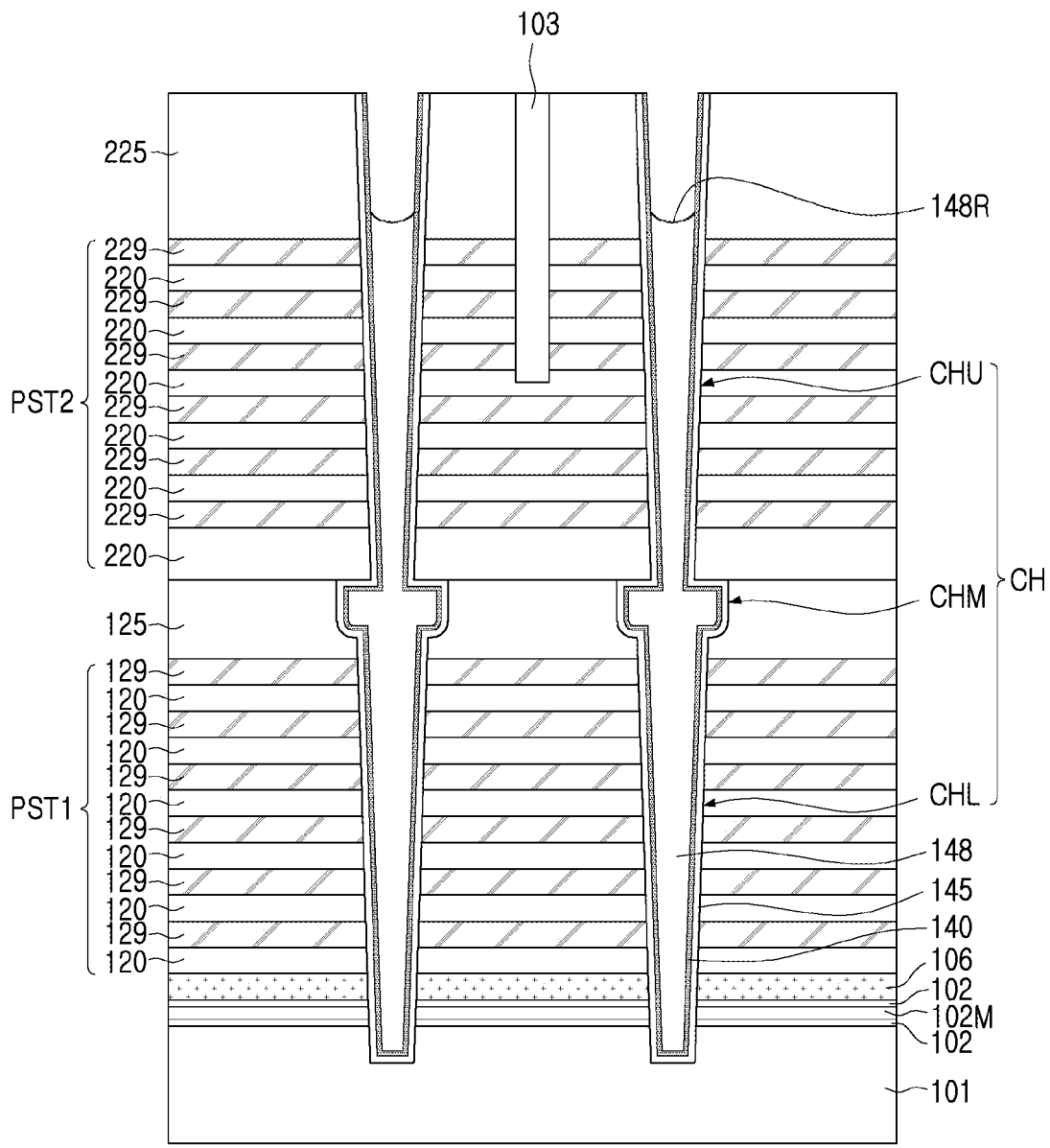
Figure 8H:
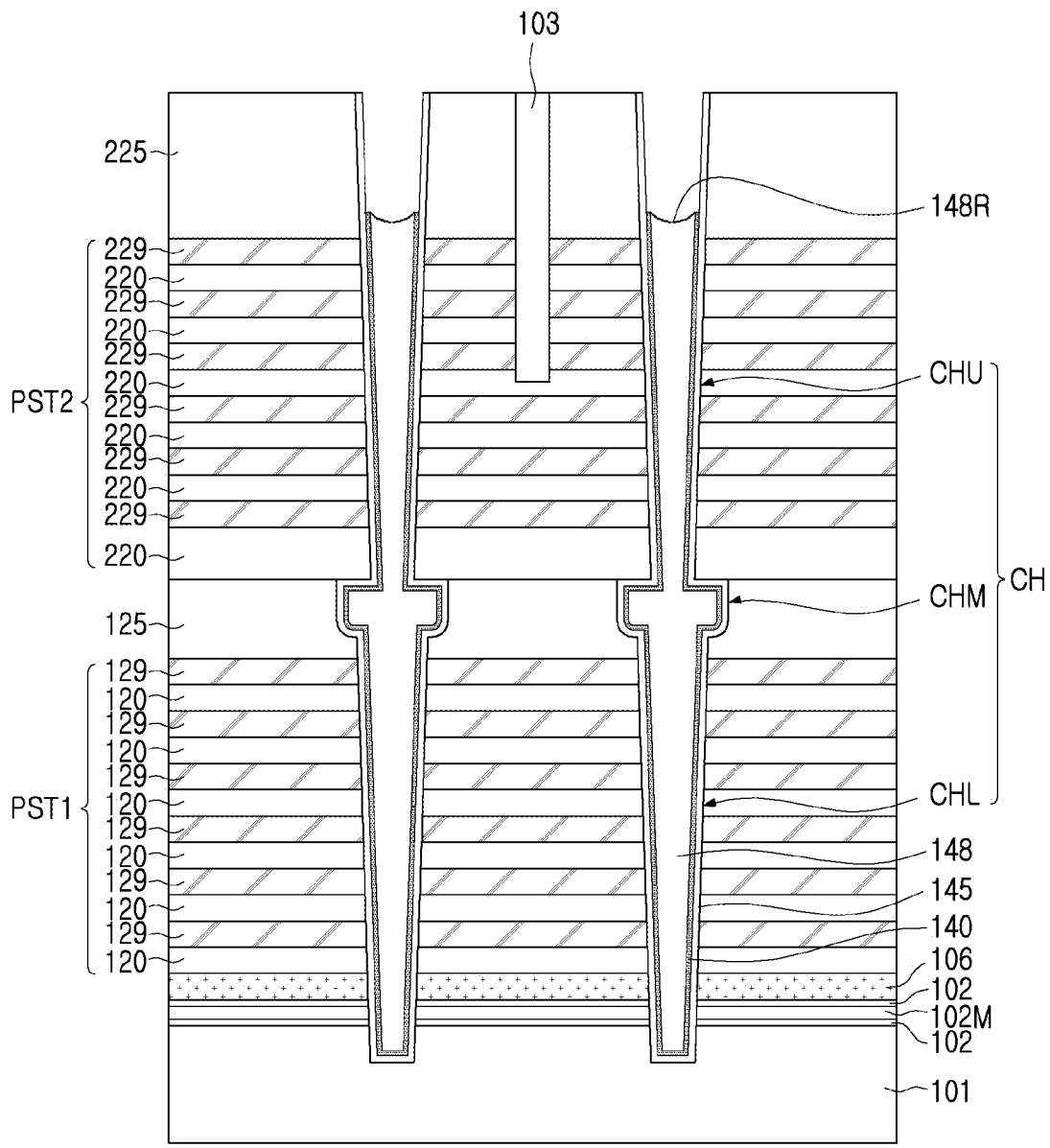
Figure 8I:
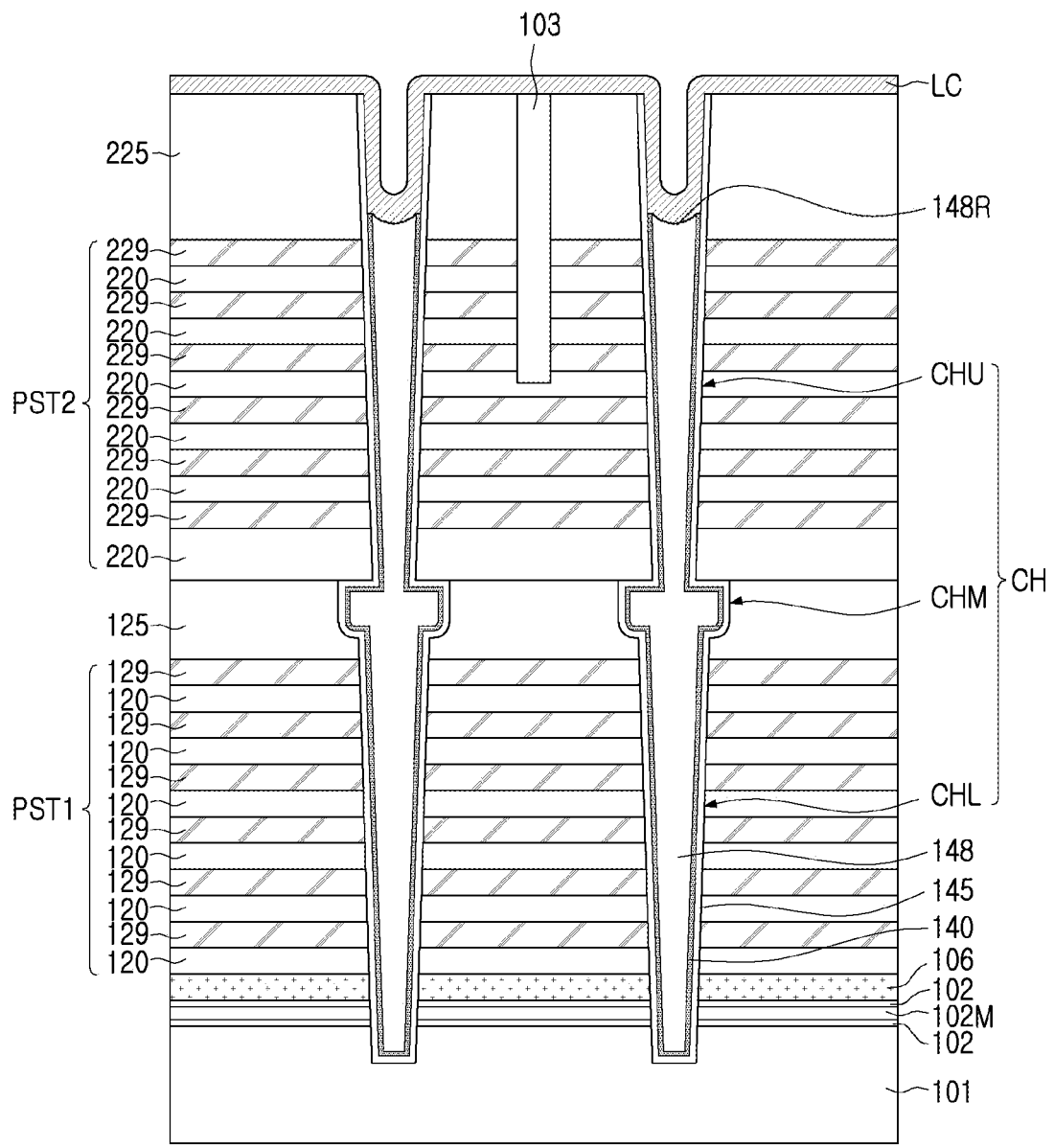
Figure 8J:
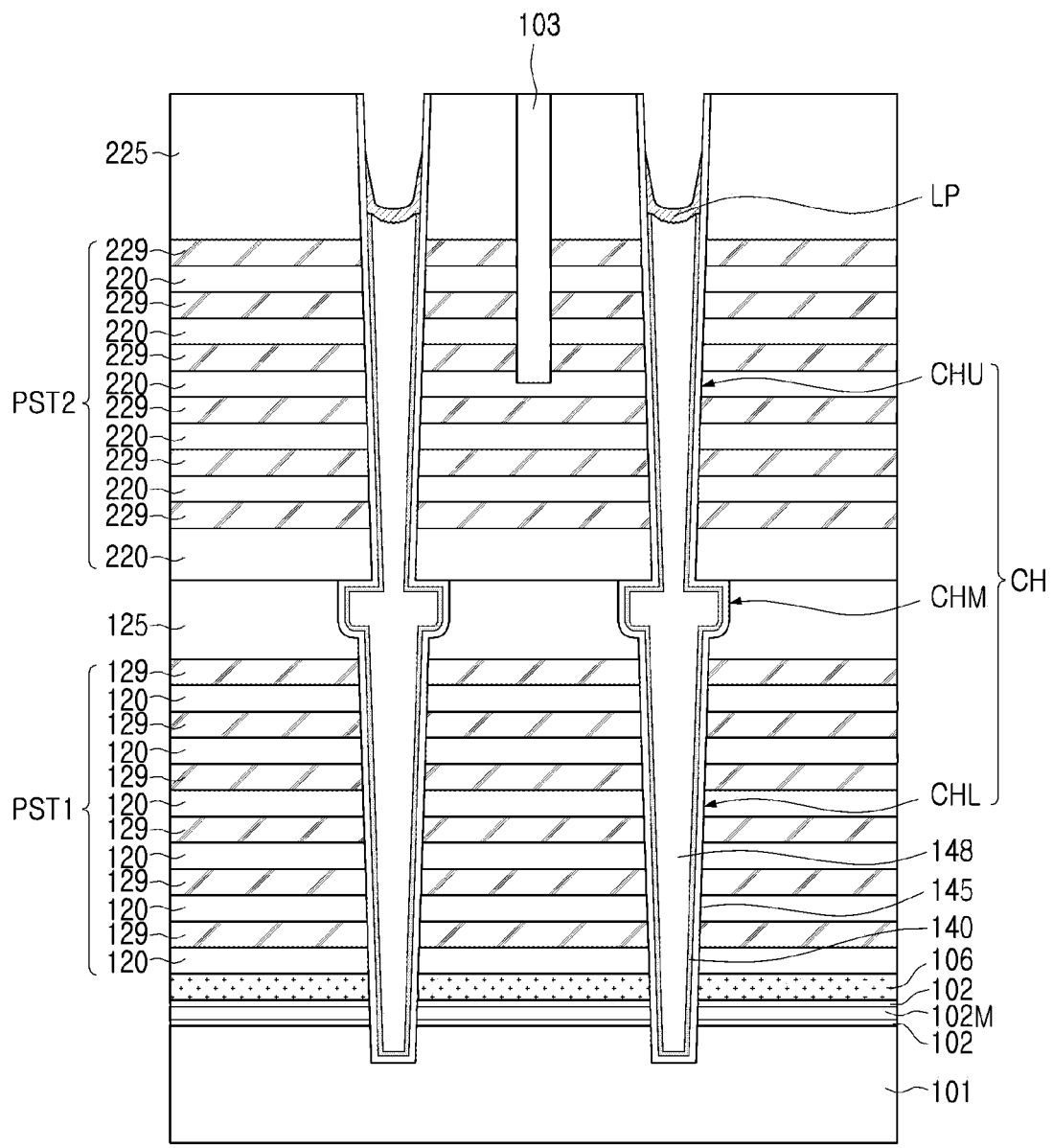

Referring to FIG. 8I to be described later, the dummy channel structure DCH may form sacrificial structures 108 and 110 penetrating through the first preliminary stack structure PST1, and the dummy channel structure DCH may be a structure that the sacrificial structures 108 and 110 are not opened by the first hole H1 when forming the first hole H1. Even when the first hole H1 is not aligned with the sacrificial structures 108 and 110, or even when the first hole H1 is not formed deep enough to recess the upper portions of the sacrificial structures 108 and 110, a dummy channel structure DCH illustrated in FIG. 3 may be formed.

The dummy channel structure DCH may be disposed to penetrate the first gate electrodes 130. An upper surface of the dummy channel structure DCH may be substantially coplanar with the upper surface of the intermediate insulating layer 125. The dummy channel structure DCH may include a lower semiconductor pattern 108 having a recess and an upper semiconductor pattern 110 disposed in the recess of the lower semiconductor pattern 108. The lower semiconductor pattern 108 may have an inclined side surface that narrows towards the substrate 101 according to an aspect ratio. The upper semiconductor pattern 110 may have a first pattern 111 disposed in the recess and a second pattern 112 extending from the uppermost end of the first pattern 111 in a direction, parallel to the upper surface of the substrate 101 on the first pattern 111. The width of the first pattern 111 may decrease towards the substrate 101. The second pattern 112 may have a width greater than a width of the first pattern 111. An outer side surface of the second pattern 112 may extend from the uppermost end of the lower semiconductor pattern 108 to form a curved surface. The width of the second pattern 112 may increase upwardly, but is not limited thereto.

On the dummy channel structure DCH, a second stack structure ST2 may be disposed, or, in a region in which the second stack structure ST2 of the second region of the substrate 101 does not overlap the first stack structure ST1, a first insulating layer 225' may be disposed. A portion of the first insulating layer 225' may cover the second stack structure ST2 in the first region of the substrate 101. The dummy channel structure DCH may be disposed below the second stack structure ST2.

The lower semiconductor pattern 108 and the upper semiconductor pattern 110 may include a semiconductor material such as polycrystalline silicon or monocrystalline silicon, and the semiconductor material may be an undoped material or a material containing p-type or n-type impurities. In some example embodiments, at least the upper semiconductor pattern 110 may be a doped layer, and the lower semiconductor pattern 108 may be a doped layer or a layer including impurities diffused from the upper semiconductor pattern 110.

In some example embodiments, the lower semiconductor pattern 108 and the upper semiconductor pattern 110 may include first impurities, and the upper semiconductor pattern 110 may further include second impurities. The first impurities and the second impurities may include impurities of different elements. The first impurities may be impurities diffused from the upper semiconductor pattern 110 to the lower semiconductor pattern 108 by injecting impurities in-situ in the process of forming the upper semiconductor pattern 110. The first impurities may be, for example, at least one of boron (B), phosphorus (P), and arsenic (As). The second impurities may include carbon (C) and/or chlorine (Cl). In some example embodiments, the second impurities may not diffuse to the lower semiconductor pattern 108.

Referring to FIG. 3D, in the dummy channel structure DCH, a structure of the upper semiconductor pattern 110 may be different. The upper semiconductor pattern 110 may include a second lower pattern 112a_2 having a convex shape from the upper end of the lower semiconductor pattern 108 on the outer side surfaces of the first pattern 111, the second pattern 112a, and the lower semiconductor pattern 108. The second lower pattern 112a_2 may be a lower pattern of a portion in which the second pattern 112a is extended in a horizontal direction. The second lower pattern 112a_2 may be a pattern formed by etching further below the peripheral region during the etching process of the intermediate insulating layer 125.

Figure 4A:
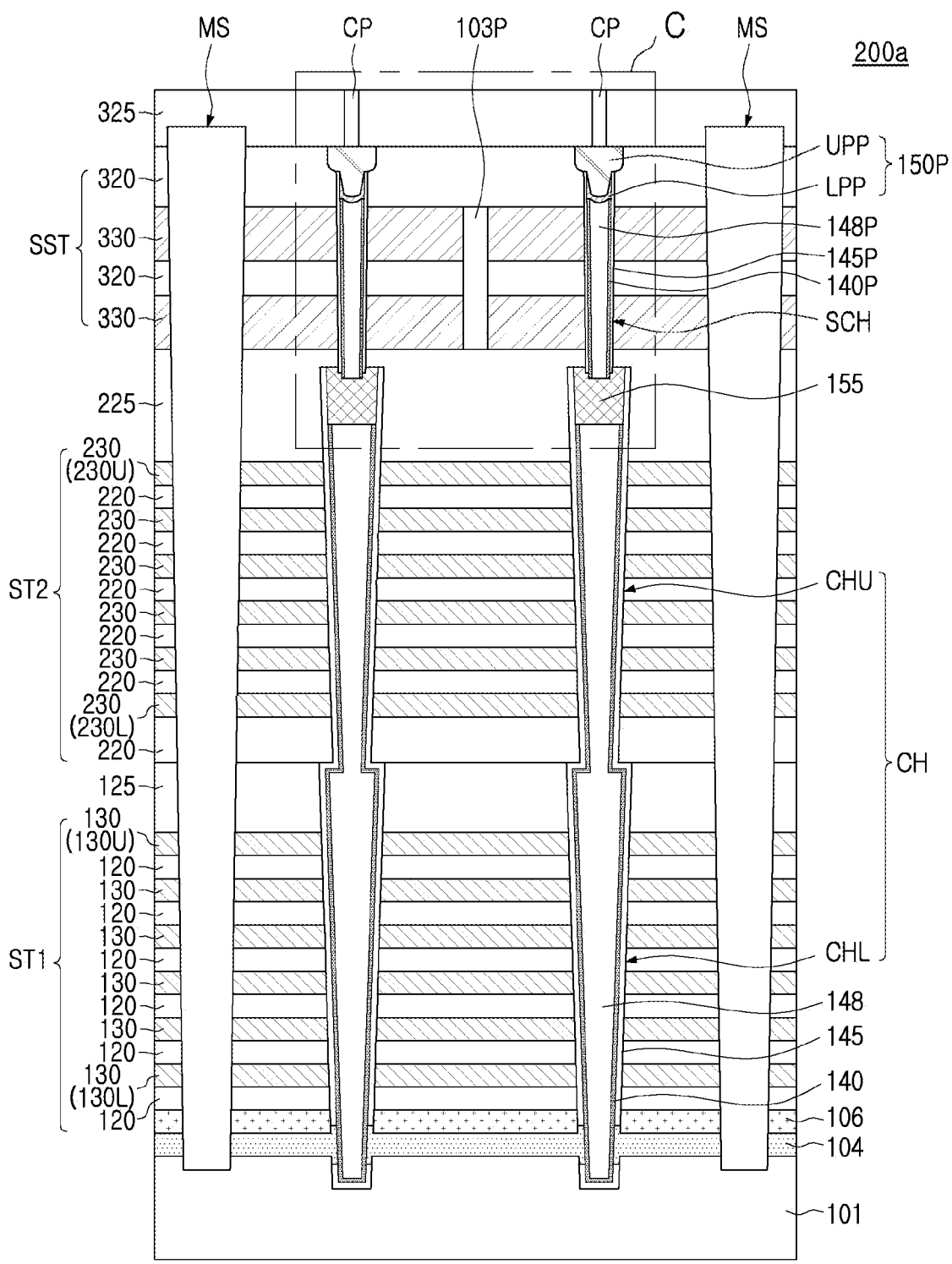
FIGS. 4A to 4C are partial enlarged cross-sectional views illustrating an example of a semiconductor device according to example embodiments of the present inventive concepts.

FIG. 4A is a cross-sectional view illustrating an example of a semiconductor device according to example embodiments of the present inventive concepts.

Referring to FIG. 4A, a semiconductor device 200a may include a substrate 101, a first stack structure ST1, a second stack structure ST2, a channel structure CH, a separation region MS, an intermediate insulating layer 125, a first insulating layer 225, and/or an upper insulating layer 325, as described above with reference to FIGS. 1A, 2A, and 3A. The channel structure CH may be formed of a lower channel structure CHL and an upper channel structure CHU without a connection structure, and may include a buried channel pad 155. The semiconductor device 200a may further include an upper stack structure SST on the first insulating layer 225 and a string selection channel structure SCH penetrating the upper stack structure SST.

The upper stack structure SST may be disposed on the channel structures CH. The upper stack structure SST may include an upper interlayer insulating layers 320 and upper gate electrodes 330, alternately stacked.

The upper gate electrodes 330 may be gate electrodes forming a string selection transistor. The upper gate electrodes 330 may also be separated from each other by a string upper separation region 103P. The upper gate electrodes 330 may also be separated from each other by the separation region MS. The upper gate electrodes 330 may include a semiconductor material such as polycrystalline silicon or monocrystalline silicon, and the semiconductor material may be a material that is not doped or a material containing p-type or n-type impurities. The number of gate electrode layers forming the upper gate electrodes 330 may be one or two or more, and may have different structures from the first and second gate electrodes 130 and 230 of the memory cells.

The string upper separation region 103P may be in a form of a line or a rectangle extending in at least one direction, but may also be disposed in a zigzag form in at least one direction.

The upper interlayer insulating layers 320 may be respectively disposed between the upper gate electrodes 330. The upper interlayer insulating layers 320 may include an insulating material such as silicon oxide or silicon nitride The string selection channel structures SCH may be disposed by partially recessing the upper portion of the buried channel pad 155 of the channel structure CH, or may be disposed on the buried channel pad 155 so as to contact the upper surface of the buried channel pad 155. The string selection channel structures SCH may include a string selection channel layer 140P, a string selection gate dielectric layer 145P between the string selection channel layer 140P and the upper gate electrodes 330, a string selection channel insulating layer 148P inside the string selection channel layer 140P, and a string select channel pad 150P covering an upper surface of the string select channel insulating layer 148P and electrically connected to the string select channel layer 140P.

The string selection channel structures SCH may be disposed to be spaced apart from each other in rows and columns on the second stack structure ST2, and may be disposed to overlap the channel structures CH. The string selection channel structures SCH may be disposed to form a grid pattern or may be disposed in a zigzag form in one direction. The string selection channel structures SCH may have a columnar shape, and may have an inclined side surface that becomes narrower towards the substrate 101 according to an aspect ratio. The string selection channel structures SCH may penetrate the upper gate electrodes 330. The string select channel layer 140P may be electrically insulated from the upper gate electrodes 330 by the string selection gate dielectric layer 145P. The string selection channel structures SCH may have a maximum diameter smaller than the maximum diameter of the channel structures CH, but are not limited thereto.

The string selection channel layer 140P may have the same or similar structure to the channel layer 140, and the string channel insulation layer 148P may have the same or similar structure to the channel insulation layer 148. However, the string selection gate dielectric layer 145P may be made of an insulating material, and may include the same material as the upper interlayer insulating layer 320. The string selection channel layer 140P and the string channel insulation layer 148P may have a smaller width and a smaller thickness than the channel layer 140 and the channel insulation layer 148.

The string selection channel pad 150P may include a string selection lower pad LPP and a string selection upper pad UPP. The string selection channel pad 150P may have the same or similar structure to the channel pad 150. For the string selection channel pad 150P, the above description for the channel pad 150 may be applied the same or substantially the same. For example, the string selection lower pad LPP may have a recess between inner side surfaces of the string selection gate dielectric layer 145P, and the string selection upper pad UPP may include a third portion disposed in the recess, and a fourth portion extending from the upper end of the third portion in a direction, parallel to the upper surface of the substrate 101 on the third portion. However, the size of the string selection channel pad 150P may be smaller than the size of the channel pad 150.

In the present specification, the string selection channel structure SCH, the string selection channel layer 140P, the string selection gate dielectric layer 145P, the string selection channel insulating layer 148P, and the string selection channel pad 150P may also be referred to as a channel structure, a channel layer, a gate dielectric layer, a channel insulating layer, and a channel pad, respectively.

Figure 4B:
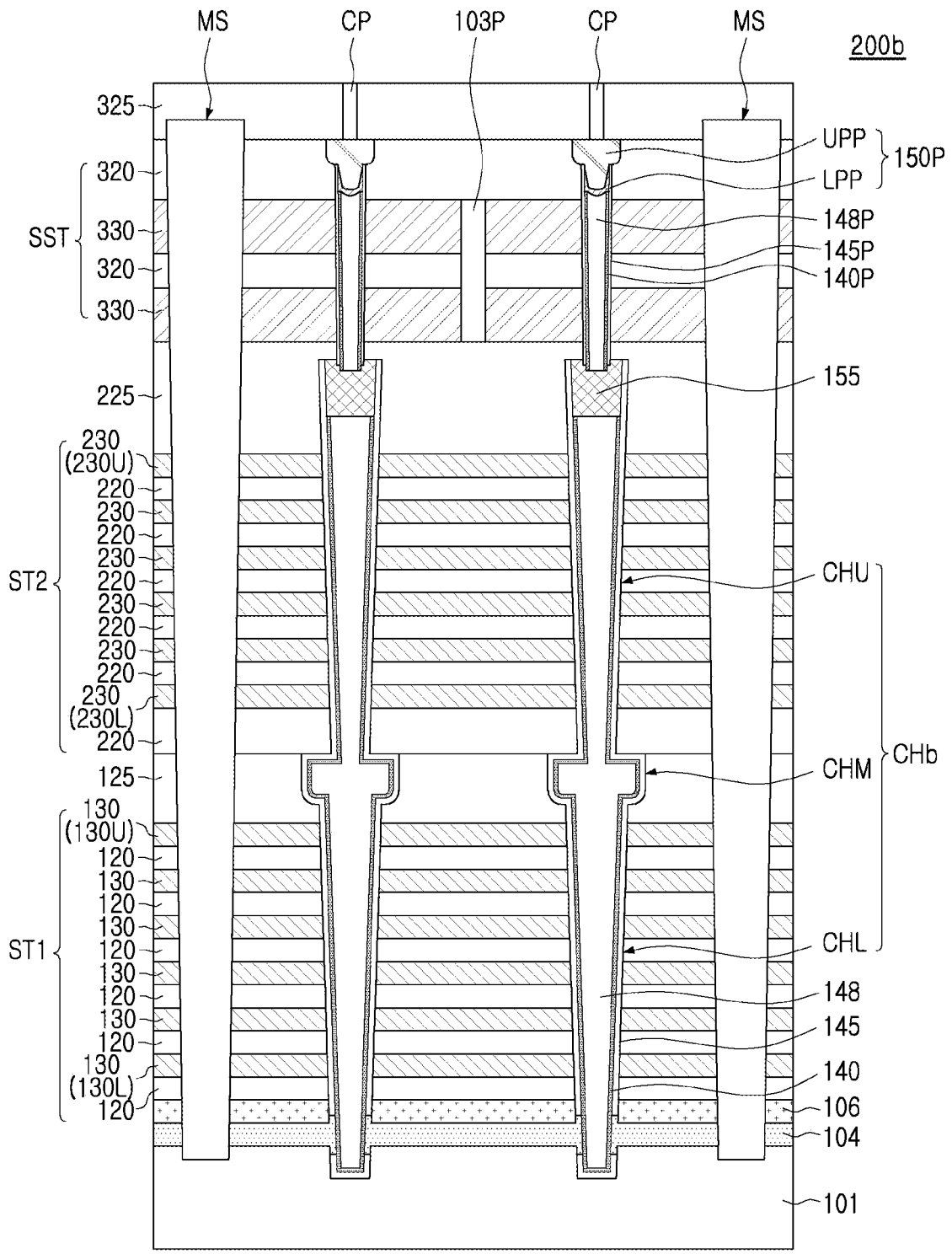

FIG. 4B is a cross-sectional view illustrating an example of a semiconductor device according to example embodiments of the present inventive concepts.

Referring to FIG. 4B, in a semiconductor device 200b, a structure of the channel structure CHb may be different, compared to the example embodiment of FIG. 4A. The channel structure CHb may include a lower channel structure CHL, a connection structure CHM, and an upper channel structure CHU. The connection structure CHM may connect the lower channel structure CHL and the upper channel structure CHU. The connection structure CHM is the same or substantially the same as the above-described description with reference to FIG. 3A, and thus the description thereof will be omitted. In addition, the semiconductor device 200b may further include first to third insulating layers 225, 226, and 325.

Figure 4C:
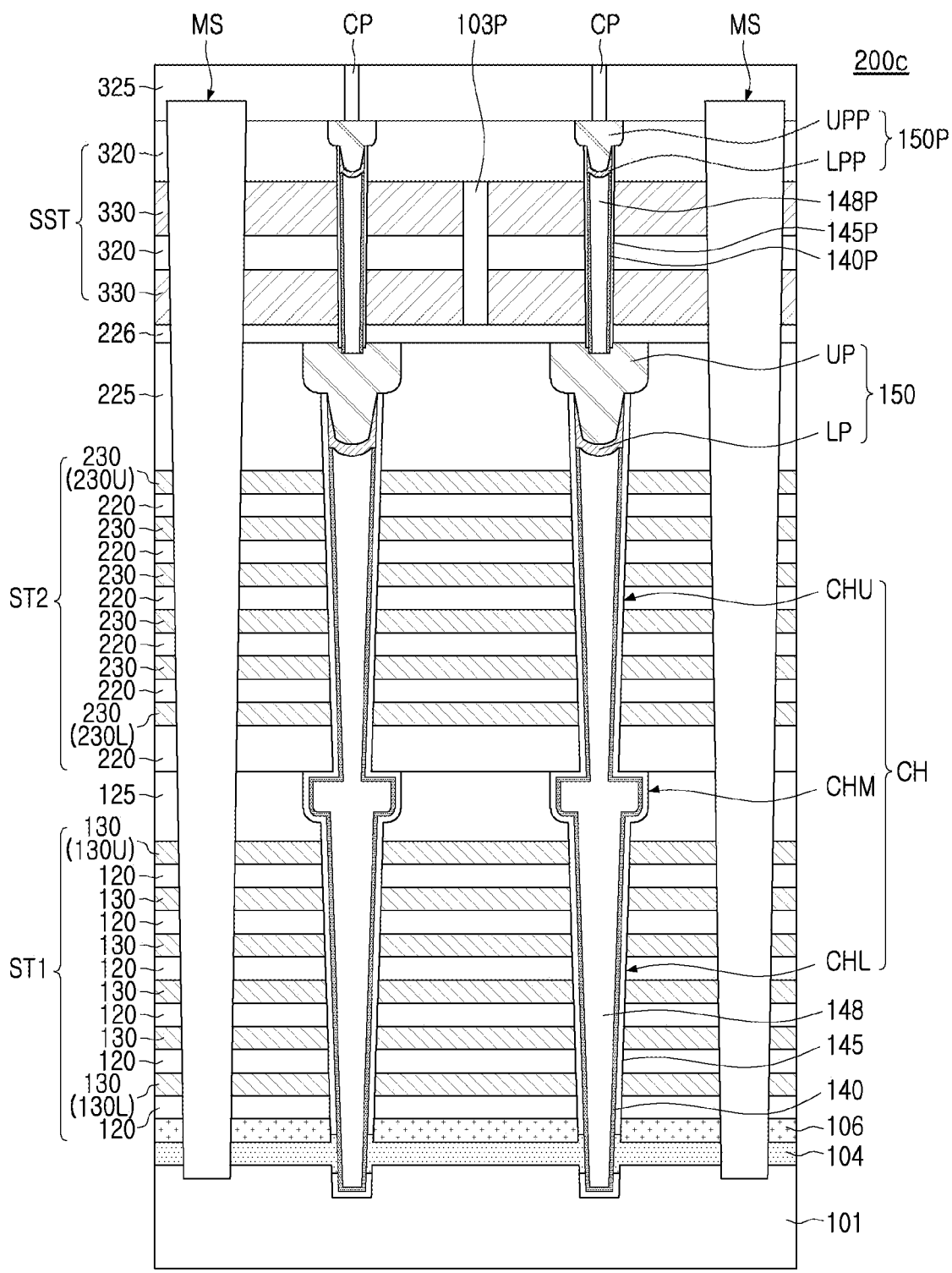

FIG. 4C is a cross-sectional view illustrating an example of a semiconductor device according to example embodiments of the present inventive concepts.

Referring to FIG. 4C, in a semiconductor device 200c, a structure of the channel structure CH may be different, compared to that in the example embodiment of FIG. 4B. The channel structure CH may include an upper channel structure CHU and a channel pad 150. The channel pad 150 may include a lower pad LP and an upper pad UP. The channel pad 150 is the same or substantially the same as the above-described description with reference to FIG. 2A, and thus the description thereof will be omitted.

Figure 5A:
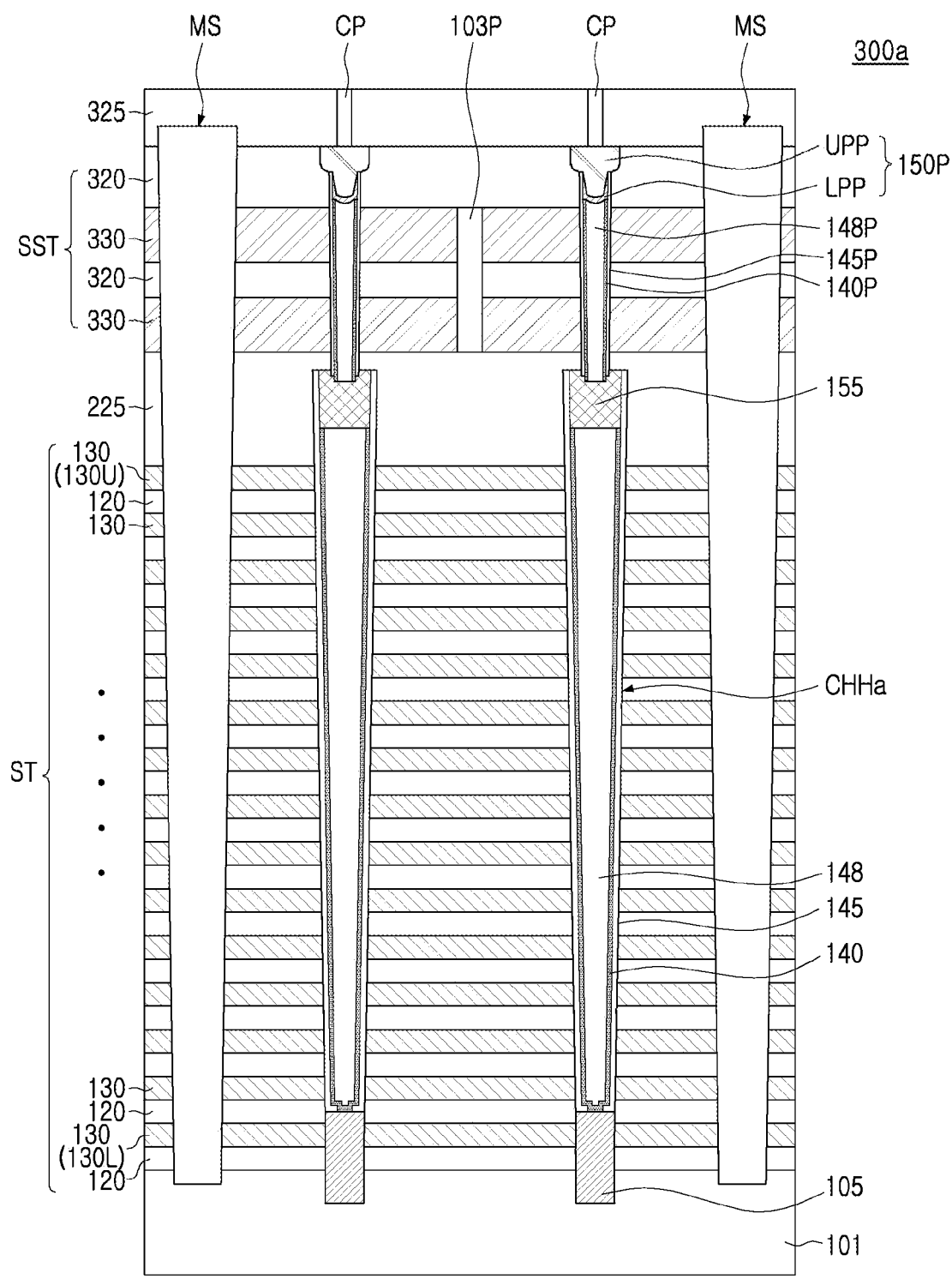
FIGS. 5A and 5B are partial enlarged cross-sectional views illustrating an example of a semiconductor device according to example embodiments of the present inventive concepts.

FIG. 5A is a cross-sectional view illustrating an example of a semiconductor device according to example embodiments of the present inventive concepts.

Referring to FIG. 5A, a semiconductor device 300a may include a substrate 101, a stack structure ST on the substrate 101, a channel structure CHHa, a separation region MS, a first insulating layer 225, an upper stack structure SST, and a string selection channel structure SCH. The stack structure ST may include first interlayer insulating layers 120 and first gate electrodes 130, alternately stacked. The channel structure CHHa may include an epitaxial layer 105, a channel layer 140, a gate dielectric layer 145, and/or a buried channel pad 155. The upper stack structure SST and the string selection channel structure SCH are the same or substantially the same as the above-described description with reference to FIG. 4A, and thus the description thereof will be omitted.

The channel structure CHHa may be disposed to penetrate through the stack structure ST. The side surface of the channel structure CHHa may be substantially flat without a bent portion. The epitaxial layer 105 may be disposed on the substrate 101 at the lower end of the channel structure CHHa, and may be disposed on the side surface of the at least one first gate electrode 130. The epitaxial layer 105 may be disposed in the recessed region of the substrate 101. A height of the upper surface of the epitaxial layer 105 may be higher than the upper surface of the first lowermost gate electrode 130L and lower than the lower surface of the upper first gate electrode 130, but is not limited to that illustrated. In example embodiments, the epitaxial layer 105 may be omitted, and in some example embodiments, the channel layer 140 may be directly connected to the substrate 101.

The separation region MS may include an insulating material and a conductive material. In example embodiments, when the separation region MS includes a conductive layer spaced apart from the first gate electrodes 130 by the insulating layer, in addition to the insulating layer, the separation region MS may include a common source line. In some example embodiments, the insulating layer may be disposed to cover side surfaces of the conductive layer.

Figure 5B:
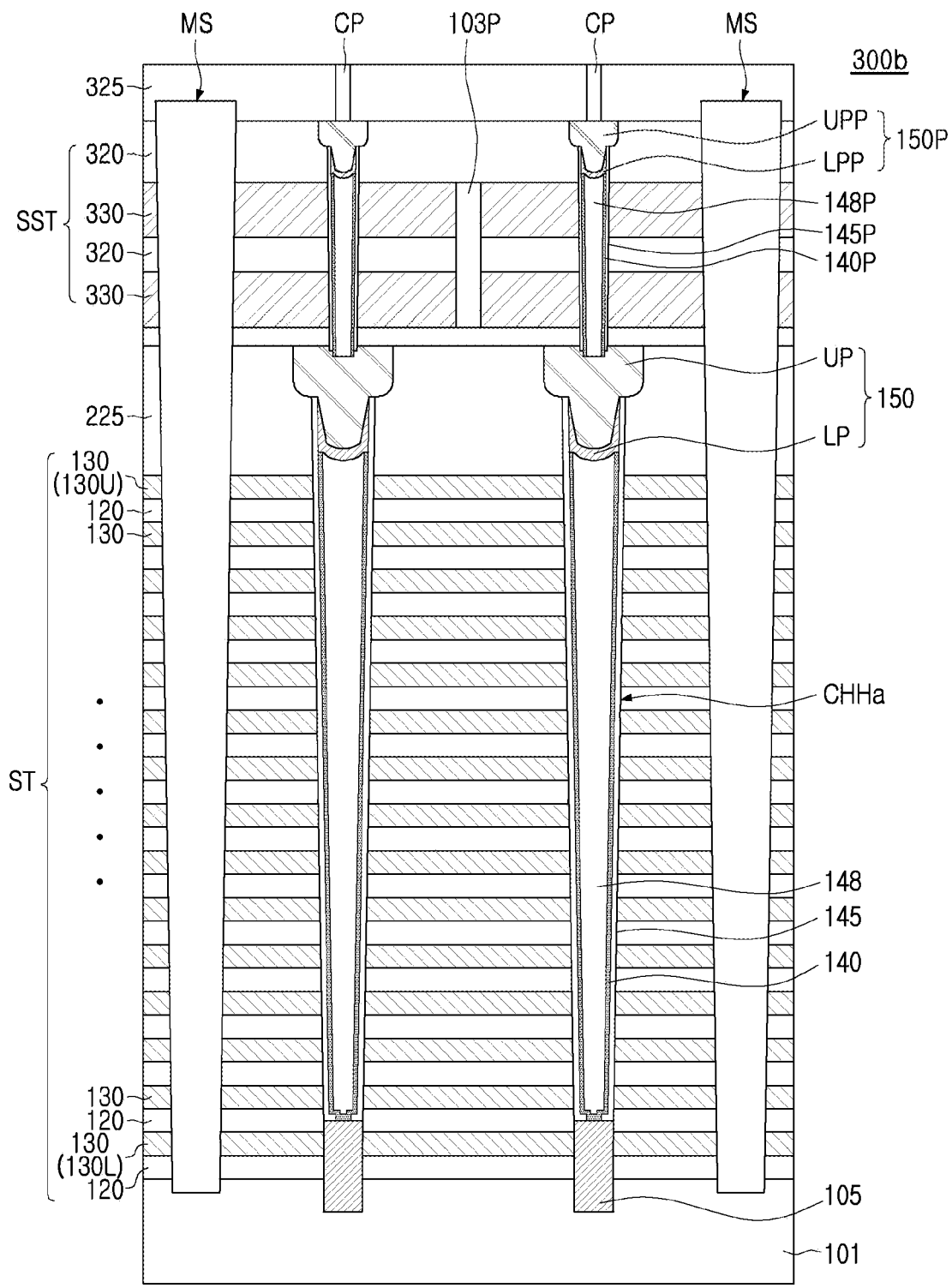

FIG. 5B is a cross-sectional view illustrating an example of a semiconductor device according to example embodiments of the present inventive concepts.

Referring to FIG. 5B, in a semiconductor device 300b, a structure of a channel structure CHHb may be different. The channel structure CHHb may include an upper channel pad 150. The channel pad 150 may include a lower pad LP and an upper pad UP. The channel pad 150 is the same or substantially the same as the above-described description with reference to FIG. 2A, and thus the description thereof will be omitted.

Figure 6:
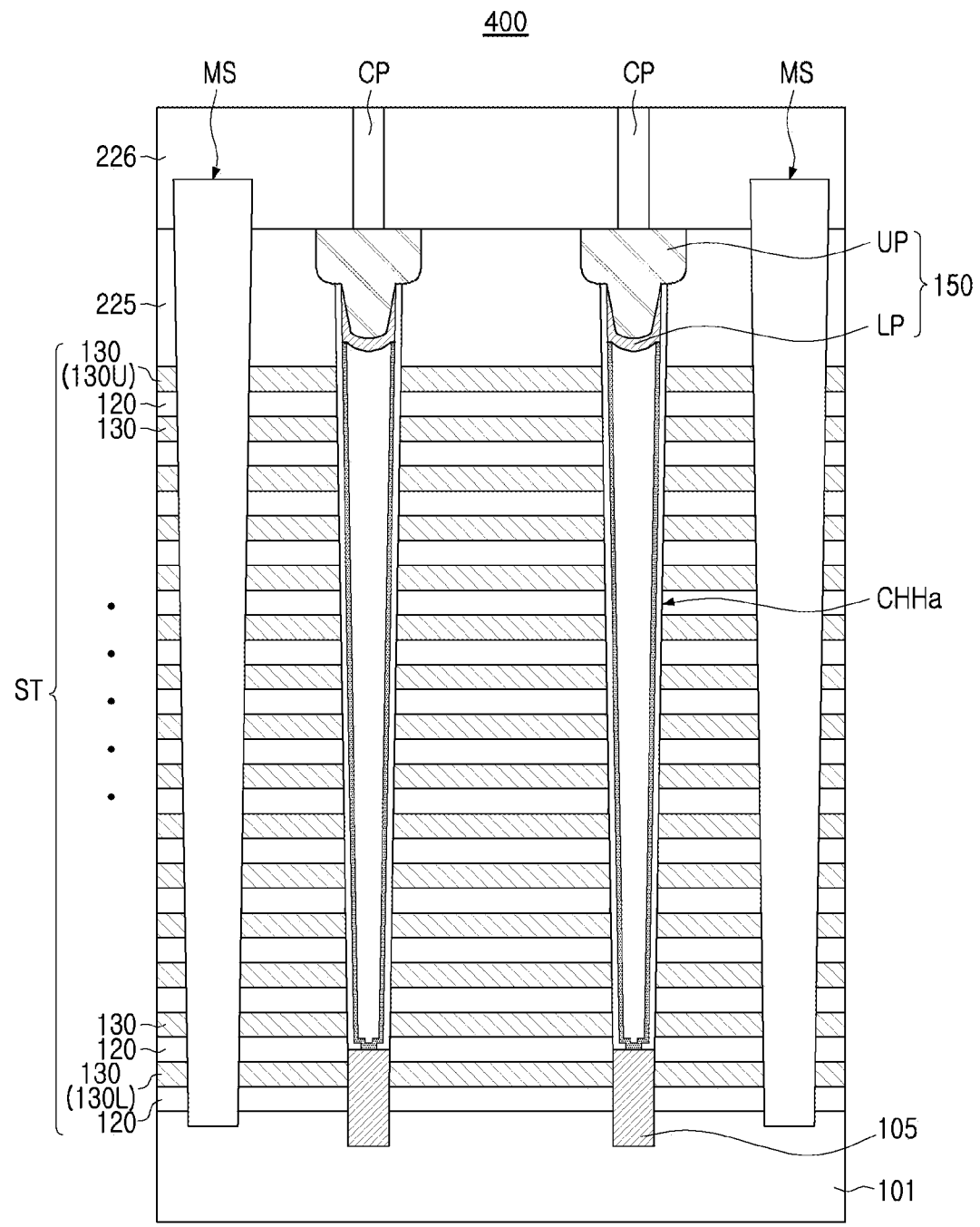
FIG. 6 is a cross-sectional view illustrating an example of a semiconductor device according to example embodiments of the present inventive concepts.

FIG. 6 is a cross-sectional view illustrating an example of a semiconductor device according to example embodiments of the present inventive concepts.

Referring to FIG. 6, a semiconductor device 400 may include a substrate 101, a stack structure ST on the substrate 101, first and second insulating layers 225 and 226, a channel structure CHHb, and/or a separation region MS. The channel structure CHHb may include an epitaxial layer 105, a channel layer 140, a gate dielectric layer 145, and/or a channel pad 150. The channel pad 150 may include a lower pad LP and an upper pad UP. The channel pad 150 is the same or substantially the same as the above-described description with reference to FIG. 2A, and thus the description thereof will be omitted.

Figure 7:
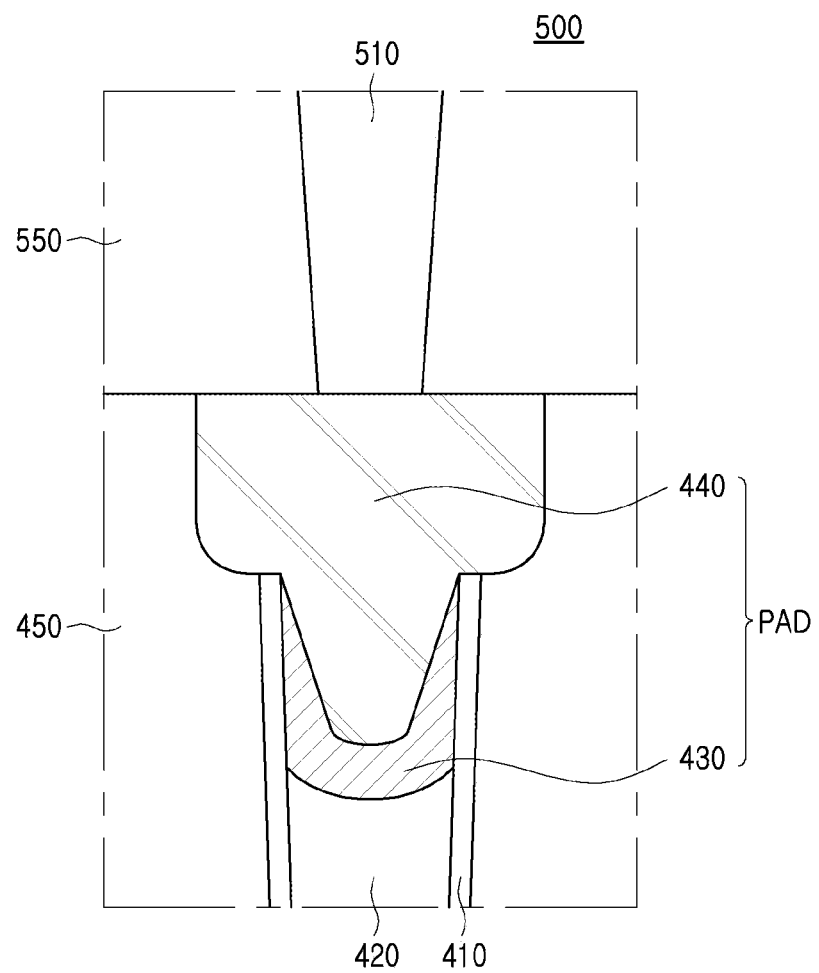
FIG. 7 is a partial enlarged cross-sectional view illustrating an example of a semiconductor device according to example embodiments of the present inventive concepts.

FIG. 7 is a partial enlarged cross-sectional view illustrating an example of a semiconductor device according to example embodiments of the present inventive concepts.

Referring to FIG. 7, a semiconductor device 500 may include a first structure 450, a first vertical structure 410 penetrating through the first structure 450, and a first insulating structure 420 inside the first vertical structure 410, a pad structure PAD on the first vertical structure 410, a second structure 550 on the first structure 450, and/or a second structure 550 penetrating through the second structure 550 and connected to the first vertical structure 410.

The first structure 450 may be a structure including first interlayer insulating layers 120 and first gate electrodes 130 alternately stacked, as illustrated in FIGS. 1A to 6. In some example embodiments, the first structure 450 may be formed of an insulating material layer. Components constituting the first structure 450 may be variously changed according to example embodiments.

A first vertical structure 410 may be disposed to penetrate through a portion of the first structure 450. The first vertical structure 410 may be formed in an annular shape surrounding the first insulating structure 420 therein, but may have a columnar shape such as a cylindrical or prismatic shape without a first insulating structure according to some example embodiments. The first vertical structure 410 may include a conductive material or an insulating material. The first vertical structure 410 may be a structure corresponding to the gate dielectric layer 145 of FIG. 2A, and a channel layer, in contact with a portion of the lower end of the first semiconductor structure 430 may be further disposed on the inner side surface.

A pad structure PAD may be disposed on the first vertical structure 410. The pad structure PAD may include a lower semiconductor structure 430 having a recess recessed downwardly from the upper surface and an upper semiconductor structure 440 disposed in the recess and having an extension portion having a side surface protruding from a side surface of the lower semiconductor structure 430 on the lower semiconductor structure 430. The width of the extension portion may be greater than the maximum width of the upper end of the first vertical structure 410. The lower semiconductor structure 430 and the upper semiconductor structure 440 may be equally applied to the contents for the lower pad LP and the upper pad UP, respectively, illustrated in FIG. 2A, respectively.

The lower semiconductor structure 430 may include silicon and first impurities, and the upper semiconductor structure 440 may include silicon, first and second impurities. The second impurities may include, for example, carbon (C) and/or chlorine (Cl). A boundary between the lower semiconductor structure 430 and the upper semiconductor structure 440 or the recess of the lower semiconductor structure 430 may be confirmed by analyzing the distribution of the second impurities in the pad structure PAD. This also applies to the channel pad, the string selection channel pad, and the dummy channel structure described with reference to FIGS. 1A to 6.

According to the technical idea of the present inventive concepts, a pad structure PAD may be introduced to connect a first vertical structure 410 and a second vertical structure 510. Since the pad structure PAD provides a width greater than the width of the first vertical structure 410, the first vertical structure 410 may be stably connected to the second vertical structure 510 by the pad structure PAD. In particular, when the widths of the first vertical structures 410 and the second vertical structures 510 are small, when it is difficult to form the first vertical structures 410 and the second vertical structures 510 aligned in the vertical direction, the pad structure PAD may be introduced such that the second vertical structure 510 may be stably connected to the first vertical structure 410.

The second structure 550 may be a structure including second interlayer insulating layers 220 and second gate electrodes 230 alternately stacked, as illustrated in FIGS. 1A to 6. In some example embodiments, the second structure 550 may be formed of an insulating material layer. The structure constituting the second structure 550 may be variously changed according to example embodiments. The second structure 550 may be, for example, a layer corresponding to the second insulating layer 226 of FIG. 1A or a layer corresponding to the third insulating layer 325 of FIG. 4A.

The second vertical structure 510 may be disposed to penetrate through a portion of the second structure 550. The second vertical structure 510 may have a columnar shape such as a cylindrical or prismatic column. The second vertical structure 510 may include a conductive material. The second vertical structure 510 may be a structure corresponding to the contact plugs MC of FIGS. 1A to 6.

FIGS. 8A to 8L are cross-sectional views illustrating an example of a method of manufacturing a semiconductor device according to example embodiments of the present inventive concepts.

Referring to FIG. 8A, first and second horizontal sacrificial layers 102 and 102M and a second horizontal conductive layer 106 may be formed on the substrate 101. A first preliminary stack structure PST1 may be formed by alternately stacking the first sacrificial layers 129 and the first interlayer insulating layer 120 on the substrate 101. An intermediate insulating layer 125 may be formed on the first preliminary stack structure PST1. First holes H1, penetrating through the first and second horizontal sacrificial layers 102 and 102M, the second horizontal conductive layer 106, the first preliminary stack structure PST1, and the intermediate insulating layer 125, may be formed. A first sacrificial semiconductor pattern 108a filling a portion of the first holes H1 may be formed.

The first and second horizontal sacrificial layers 102 and 102M may be layers that are replaced with a first horizontal conductive layer 104 through a subsequent process. The first horizontal sacrificial layers 102 may be disposed above and below the second horizontal sacrificial layer 102M, respectively.

The first sacrificial layers 129 may be layers that are replaced with the first gate electrodes 130 through a subsequent process. The first sacrificial layers 129 may be formed of a material that can be etched with an etch selectivity with respect to the first interlayer insulating layers 120. For example, the first interlayer insulating layer 120 may be formed of at least one of silicon oxide and silicon nitride, and the first sacrificial layers 129 may be made of a different material from the first interlayer insulating layer 120 selected from silicon, silicon oxide, silicon carbide, and silicon nitride. In example embodiments, the thicknesses of the first interlayer insulating layers 120 may not all be the same. For example, the lowermost first interlayer insulating layer 120 may be formed relatively thin. The thicknesses of the first interlayer insulating layers 120 and the first sacrificial layers 129 and the number of the constituent films may be variously changed from those illustrated.

The first holes H1 may penetrate through the first and second horizontal sacrificial layers 102 and 102M, the second horizontal conductive layer 106, the first preliminary laminated structure PST1, and/or the intermediate insulating layer 125. The first holes H1 may be formed to partially access an upper portion of the substrate 101. Side surfaces of the first sacrificial layers 129 and the first interlayer insulating layers 120 may be exposed by the first holes H1.

The first sacrificial semiconductor pattern 108a may be formed to fill a portion of the first holes H1. The first sacrificial semiconductor pattern 108a may conformally cover inner walls of the first holes H1, and may be formed to cover the upper surface of the intermediate insulating layer 125. The first sacrificial semiconductor pattern 108a may be formed to have deep grooves or recesses extending from the first holes H1 toward the substrate 101. The first sacrificial semiconductor pattern 108a may be formed of a semiconductor material such as polycrystalline silicon or monocrystalline silicon, and the semiconductor material may be an undoped material.

Referring to FIG. 8B, a portion of the first sacrificial semiconductor pattern 108a may be removed to form a lower semiconductor pattern 108.

Removing a portion of the first sacrificial semiconductor pattern 108a may include a process using a first etching process. The first etching process may be performed, for example, as a dry etching process. Gas used in the first etching process may include, for example, at least one of $Cl_2$, $F_2$, HBr, and HCl. By the dry etching process, the lower semiconductor pattern 108 may be formed to have recesses or grooves, for example, of a 'U' shape, a 'V' shape, or a similar shape thereof. An uppermost height of the lower semiconductor pattern 108 may be variously changed according to example embodiments. For example, a lower semiconductor pattern 108 may be formed by removing a portion of the first sacrificial semiconductor pattern 108a such that the uppermost end of the lower semiconductor pattern 108 has a first height h from the upper surface of the uppermost first sacrificial layer 129.

Referring to FIG. 8C, a portion of the intermediate insulating layer 125 may be selectively removed with respect to the lower semiconductor pattern 108 to form a first extension region E1.

Referring to FIG. 8C, a portion of the intermediate insulating layer 125 may be selectively removed with respect to the lower semiconductor pattern 108 to form a first extension region E1. The second etching process may be performed, for example, by a wet etching process. Gas used in the second etching process may include, for example, at least one of HF, $NF_3$, and $NH_3$. By the gas used in the second etching process, the intermediate insulating layer 125, adjacent to the first extension region E1, may include fluorine (F) as an impurity. The intermediate insulating layer 125 may be isotropically etched by the second etching process. A portion of the intermediate insulating layer 125 may be selectively removed by the second etching process, and the first and second horizontal sacrificial layers 102 and 102M, the second horizontal conductive layer 106, and the first preliminary stack structure PST1 may be protected by a lower semiconductor pattern 108.

In the step of forming the first extension region E1, since the lower semiconductor pattern 108 serves as a mask, in one region of the intermediate insulating layer 125, adjacent to the uppermost end of the lower semiconductor pattern 180, the first extension region E1 may be formed to extend from the upper end of the lower semiconductor pattern 108 in a direction, parallel to the upper surface of the substrate 101. A lower end of the first extension region E1 may be positioned as high as a first height h1 from the upper surface of the uppermost first sacrificial layer 129. A first distance d1 in which the first extension region E1 extends in a horizontal direction from the uppermost end of the lower semiconductor pattern 108 may be variously modified according to example embodiments.

Referring to FIG. 8D, an upper semiconductor pattern 110 filling the first holes H1 and the first extension region E1 may be formed.

The upper semiconductor pattern 110 may include a first pattern 111 filling between the inner side surfaces of the lower semiconductor pattern 108 in the first holes H1 and a second pattern 112 disposed on the first pattern 111 and filling between the inner side surfaces of the first extension region E1. The second pattern 112 may be formed to cover the upper surface of the intermediate insulating layer 125. The upper semiconductor pattern may include a semiconductor material such as polycrystalline silicon or monocrystalline silicon, and the semiconductor material may be an undoped material or a material containing p-type or n-type impurities.

In a step of forming the upper semiconductor pattern 110, impurities may be injected in in-situ. The impurity may include, for example, at least one of boron (B), phosphorus (P), arsenic (As), carbon (C), and chlorine (Cl). Among the impurities, boron (B), phosphorus (P), and arsenic (As) may diffuse into the lower semiconductor pattern 110, but carbon (C) and chlorine (Cl) may not diffuse into the lower semiconductor pattern 110.

Referring to FIGS. 8E and 8F, upper surfaces of the upper semiconductor pattern 110 and the intermediate insulating layer 125 may be planarized. A second preliminary stack structure PST2 may be formed by alternately stacking the second sacrificial layers 229 and the second interlayer insulating layers 220 on the intermediate insulating layer 125. Second holes H2 penetrating through the second preliminary stack structure PST2 may be formed. The first insulating layer 225 on the second preliminary stack structure PST2 may be formed. An upper separation region 103 penetrating through a portion of the second preliminary stack structure PST2 may be formed.

Second sacrificial layers 229 may be a layer that is replaced with the second gate electrodes 230 through a subsequent process. The descriptions of the second sacrificial layers 229 and the second interlayer insulating layers 220 are the same as those of the first sacrificial layers 129 and the first interlayer insulating layers 120, respectively, and thus the description thereof will be omitted.

The second holes H2 may pass through the second preliminary stack structure PST2 to partially access the upper portion of the upper semiconductor pattern 110. Side surfaces of the second sacrificial layers 229 and the second interlayer insulating layers 220 may be exposed by the second holes H2. The recessed upper surface of the upper semiconductor pattern 110 may be partially exposed by the second holes H2.

Referring to FIGS. 8F and 8G, the upper and lower semiconductor patterns 108 and 110 may be removed through the second holes H2, and a gate dielectric layer 145, a channel layer 140, and/or a channel insulating layer 148 may be formed in a region in which the upper and lower semiconductor patterns 108 and 110 are removed and in the second holes H2. An upper portion of the channel insulating layer 148 may be partially formed to form a recess 148R positioned below an upper end of the channel layer 140.

Referring to FIG. 8H, a portion of the upper portion of the channel layer 140 may be removed.

The channel layer 140 may be selectively removed with respect to the gate dielectric layer 145, the channel insulating layer 148, and/or the first insulating layer 225. An upper end of the channel layer 140 may be disposed below the upper end of the gate dielectric layer 145. The upper portion of the channel layer 140 may be partially removed such that the upper end of the channel layer 140 is positioned at the same level as the uppermost end of the recess 148R of the channel insulating layer 148.

Referring to FIG. 8I, a first preliminary pad LC may be formed on a region in which the channel insulating layer 148 and the channel layer 140 are removed.

The first preliminary pad LC may be conformally formed to cover the uppermost ends of the channel insulating layer 148 and the channel layer 140, and to cover the inner side surface of the gate dielectric layer 145. The first preliminary pad LC may be formed to cover the upper surface of the first insulating layer 225. The first preliminary pad LC may be formed of a semiconductor material such as polycrystalline silicon or monocrystalline silicon, and the semiconductor material may be an undoped material Referring to FIG. 8J, a portion of the first preliminary pad LC may be removed to form a lower pad LP. Removing a portion of the first preliminary pad LC may include performing the same process as described above with reference to FIG. 8B. However, unlike in the step of FIG. 8B, the depth of the recess or groove formed in the lower pad LP may be relatively small.

Figure 8K:
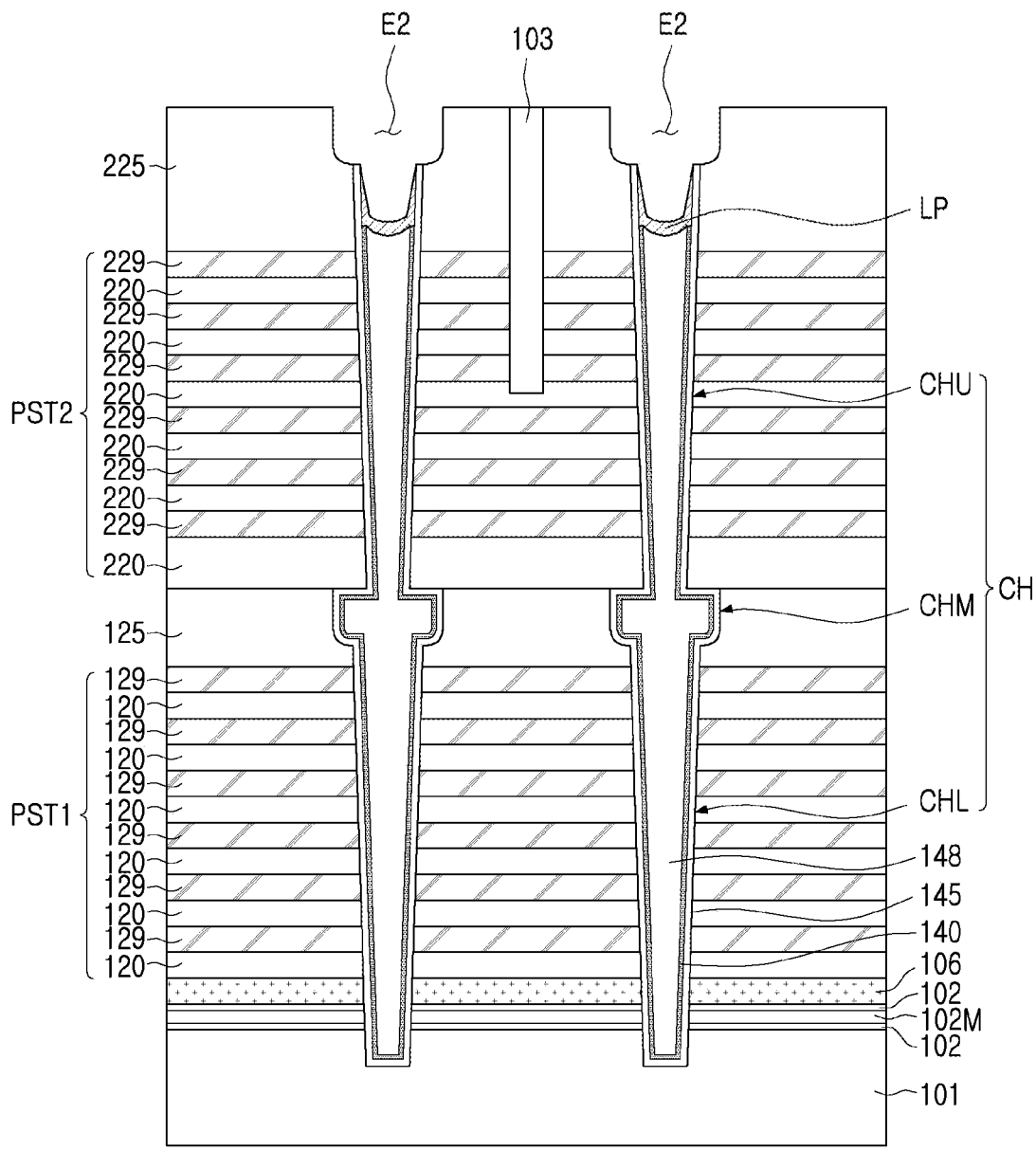

Referring to FIG. 8K, a second extension region E2 may be formed by selectively removing a portion of the first insulating layer 225 with respect to the lower pad LP. Forming the second extension region E2 may include performing the same process as described above with reference to FIG. 8C.

Figure 8L:
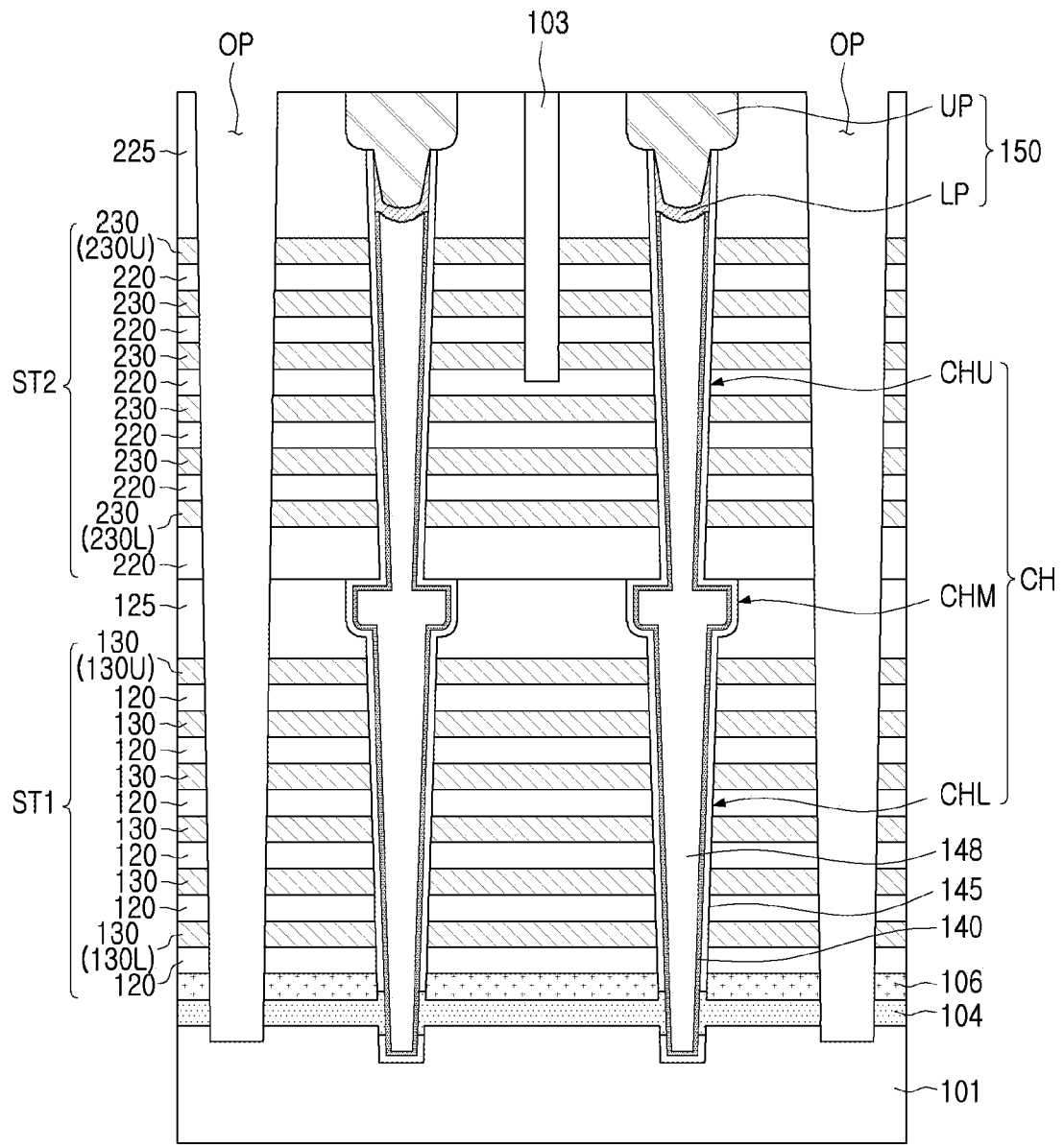

Referring to FIGS. 8K and 8L, an upper pad UP filling the recess of the lower pad LP and the second extension region E2 may be formed. The upper pad UP and the upper surface of the first insulating layer 225 may be flattened, and a channel pad 150 made of the lower pad LP and the upper pad UP may be formed. Openings OP, penetrating through the first and second preliminary stack structures PST1 and PST2, may be formed, and first and second sacrificial layers 129 and 229 may be removed through the openings OP. First and second gate electrodes 130 and 230 may be formed by burying a conductive material in a region in which the first and second sacrificial layers 129 and 229 are removed through the openings OP. The first and second horizontal sacrificial layers 102 and 102M may be removed to form a first horizontal conductive layer 104.

The openings OP may be formed by forming a mask layer using a photolithography process and anisotropically etching the first and second preliminary stack structures PST1 and PST2. The openings OP may be formed in a trench shape at a position corresponding to the separation region MS. In the present step, the substrate 101 may be exposed below the openings OP. The first and second gate electrodes 130 and 230 may include metal, polycrystalline silicon, or metal silicide material. The openings OP may provide a transfer path of the material for forming the first and second gate electrodes 130 and 230.

After forming the first and second gate electrodes 130 and 230, a material forming the first and second gate electrodes 130 and 230 deposited in the openings OP may be removed through an additional process.

First and second horizontal sacrificial layers 102 and 102M may be removed through the openings OP. In the present step, a portion of the gate dielectric layer 145, in contact with the first and second horizontal sacrificial layers 102 and 102M, may also be removed. A first horizontal conductive layer 104 may be formed in a region in which the first and second horizontal sacrificial layers 102 and 102M are removed. The first horizontal conductive layer 104 may be formed to directly contact the channel layer 140 in a region in which a portion of the gate dielectric layer 145 is removed.

An insulating material may be embedded in the openings OP to form a separation region MS.

FIGS. 9A to 9G are cross-sectional views illustrating an example of a method of manufacturing a semiconductor device according to example embodiments of the present inventive concepts. FIGS. 9A to 9G illustrate an example of a method of manufacturing a semiconductor device for forming a portion indicated by 'C' in FIG. 4A. Manufacturing steps of FIGS. 9A to 9G may be performed to manufacture example embodiments of a semiconductor device including an upper stack structure SST, a string selection channel structure SCH, and a string selection channel pad 150P.

Figure 9A:
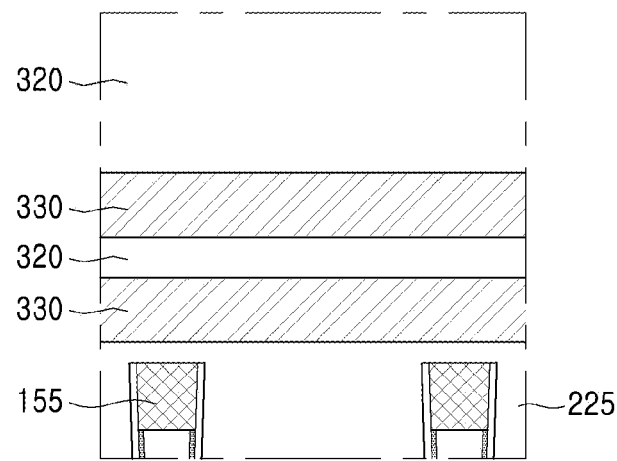
FIGS. 9A to 9G are cross-sectional views illustrating an example of a manufacturing method of a semiconductor device according to example embodiments of the present inventive concepts.

Referring to FIG. 9A, upper gate electrodes 330 and upper interlayer insulating layers 320 may be alternately stacked on a first insulating layer 225.

The upper gate electrodes 330 may be gate electrodes forming a string selection transistor. The upper gate electrodes 330 may include a semiconductor material such as polycrystalline silicon or monocrystalline silicon, and the semiconductor material may be a material that is not doped or a material containing p-type or n-type impurities.

The upper interlayer insulating layers 320 may include an insulating material such as silicon oxide or silicon nitride.

Figure 9B:
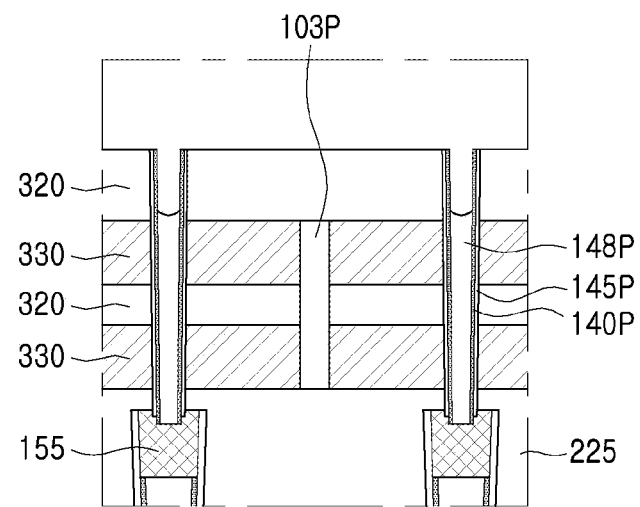

Referring to FIG. 9B, a string selection separation region 103P passing through the upper gate electrodes 330 and the upper interlayer insulating layers 220 may be formed, a string selection gate dielectric layer 145P, a string selection channel layer 140P, and/or a string selection channel insulating layer 148P may be formed. An upper portion of the string selection channel insulating layer 148P may be partially removed to form a recess disposed lower than an upper end of the string selection channel layer 140P.

Figure 9C:
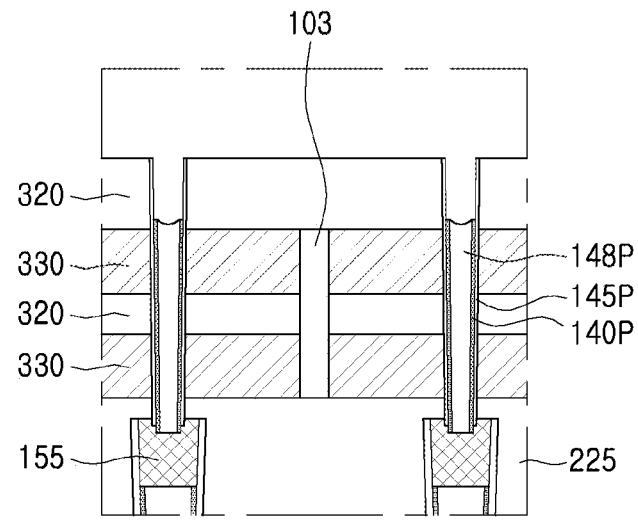

Referring to FIG. 9C, an upper portion of the string selection channel layer 140P may be partially removed. The string selection channel layer 140P may be selectively removed with respect to the string selection gate dielectric layer 145P, the string selection channel insulating layer 148P, and/or the upper interlayer insulating layers 320.

Figure 9D:
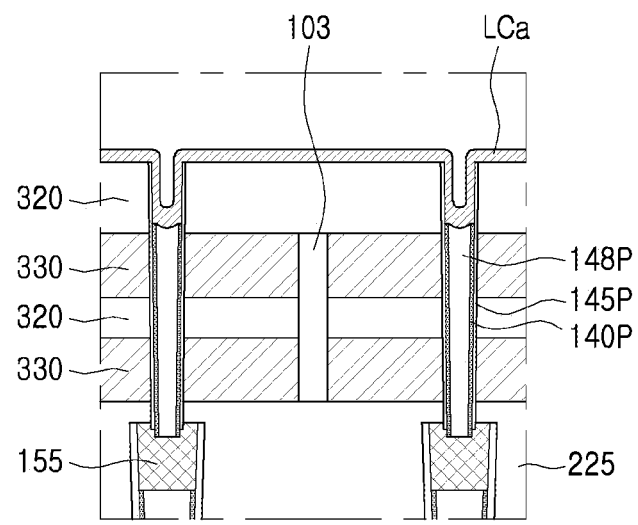

Referring to FIG. 9D, a first upper preliminary pad LCa may be formed on a region from which the string selection insulating layer 148P and the string selection channel layer 140P are removed. Forming the first upper preliminary pad LCa may include performing the same process as described above with reference to FIG. 8I.

Figure 9E:
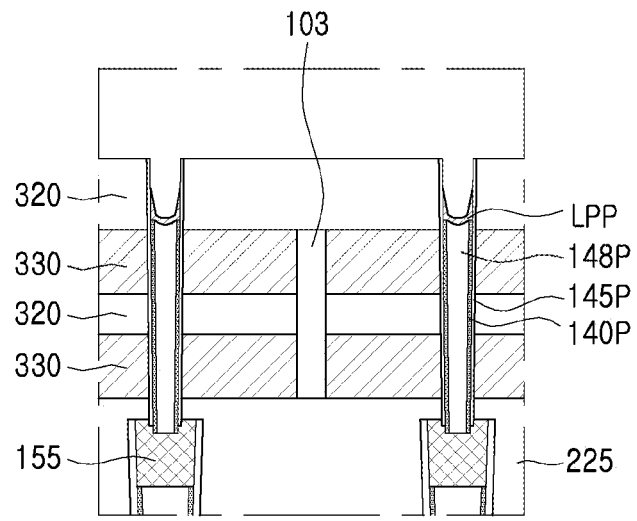

Referring to FIG. 9E, a portion of the first upper preliminary pad LCa may be removed to form a string selection lower pad LPP. Forming the string selection lower pad LPP may include performing the same process as described above with reference to FIG. 8J. However, the string selection lower pad LPP may be relatively smaller in size than the lower pad LP.

Figure 9F:
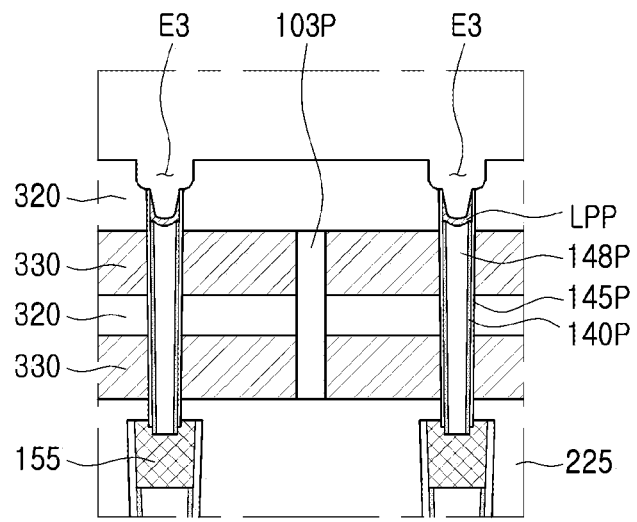

Referring to FIG. 9F, a third extension region E3 may be formed by selectively removing a portion of the upper interlayer insulating layer 320 with respect to the string selection lower pad LPP. Forming the third extension region E3 may include performing the same process as described above with reference to FIG. 8K.

Figure 9G:
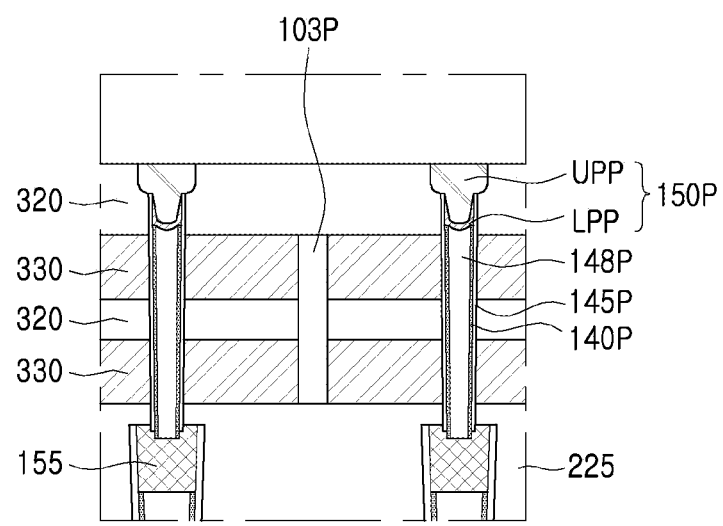

Referring to FIG. 9G, a string selection upper pad UPP filling the recess of the string selection lower pad LPP and the third extension region E3 may be formed. Upper surfaces of the string selection upper pad UPP and the upper interlayer insulating layer 320 may be flattened to form a string selection channel pad 150P composed of a string selection lower pad (LPP) and a string selection upper pad UPP.

Referring to FIG. 4A together, a third insulating layer 325 may be formed, openings penetrating through the upper interlayer insulating layers 320 may be formed, and gate electrodes and a first horizontal conductive layer may be formed, as described above with reference to FIG. 8L through the openings. The opening can be filled with an insulating material. A contact plug CP penetrating through the third insulating layer 325 and electrically connected to the string selection channel pad 150P may be formed.

As set forth above, according to the present inventive concepts, in a region to which the channel structure is connected, it is possible to provide a connection structure extending in a horizontal direction, such that the upper channel structure may be stably connected to the lower channel structure. In an upper portion of the channel structure, a pad extending in a horizontal direction may be provided such that the upper structure may be stably connected to the lower structure.

While example embodiments have been illustrated and described above, it will be apparent to those skilled in the art that modifications and variations could be made without departing from the scope of the present inventive concepts as defined by the appended claims.

What is claimed is:

1. A semiconductor device, comprising:
   gate electrodes on a substrate and spaced apart from each other;
   a channel structure penetrating the gate electrodes, the channel structure including a channel layer, a gate dielectric layer between the channel layer and the gate electrodes, and a channel pad facing and contacting the channel layer;
   string select gate electrodes on the gate electrodes and the channel structure; and
   a string select channel structure penetrating the string select gate electrodes and contacting the channel structure, a lower portion of the string select channel structure having a width smaller than a width of an upper portion of the channel structure,
   wherein the channel pad includes an expanded portion extending in a horizontal direction on the gate dielectric layer.

2. The semiconductor device of claim 1, wherein the expanded portion of the channel pad has a width greater than a width of the channel structure at a same level as the gate electrodes.

3. The semiconductor device of claim 1, wherein an upper surface of the channel pad has a width greater than a width of the gate dielectric layer surrounding side surfaces of the channel layer.

4. The semiconductor device of claim 1, wherein the expanded portion of the channel pad has a side surface not aligned with a side surface of the channel layer.

5. The semiconductor device of claim 1, wherein the string select channel structure includes a string select channel layer, a string select gate dielectric layer between the string select channel layer and the string select gate electrodes, and a string select channel pad facing and contacting the string select channel layer.

6. The semiconductor device of claim 5, wherein a lower portion of the string select channel layer is in contact with the channel pad.

7. The semiconductor device of claim 5, wherein the string select channel pad has a width smaller than a width of the channel pad.

8. The semiconductor device of claim 5, wherein the string select channel pad includes an expanded portion extending in the horizontal direction on the string select gate dielectric layer.

9. The semiconductor device of claim 1, further comprising an insulating layer between the channel layer and the string select gate electrodes, the insulating layer extending in the horizontal direction on the channel pad.

10. The semiconductor device of claim 1, further comprising a string select separation pattern penetrating the string select gate electrodes.

11. The semiconductor device of claim 1, wherein the gate electrodes include a first conductive material and the string select gate electrodes include a second conductive material different from the first conductive material.

12. The semiconductor device of claim 1, wherein the channel structure comprises a lower channel structure, an upper channel structure, and a connection structure connecting the upper and lower channel structures, and
   wherein the connection structure has a width is greater than a width of an upper end of the lower channel structure and greater than a width of a lower end of the upper channel structure.

13. The semiconductor device of claim 12, wherein the gate electrodes comprise a first gate stacked group and a second gate stacked group above the first gate stacked group, and
   wherein the connection structure is between the first and second gate stacked groups.

14. A semiconductor device, comprising:
   gate electrodes on a substrate and spaced apart from each other;
   a channel structure penetrating the gate electrodes, the channel structure including a channel layer, a gate dielectric layer between the channel layer and the gate electrodes, and a channel pad facing and contacting the channel layer;
   string select gate electrodes on the gate electrodes and the channel structure; and
   a string select channel structure penetrating the string select gate electrodes, the string select channel structure including a string select channel layer in contact with the channel pad, a string select gate dielectric layer between the string select channel layer and the string select gate electrodes, and a string select channel pad facing and contacting the string select channel layer,
   wherein at least one of the channel pad and the string select channel pad includes a lower portion and an upper portion expanded in a horizontal direction on the lower portion.

15. The semiconductor device of claim 14, wherein a lower portion of the string select channel structure has a width smaller than a width of an upper portion of the channel structure.

16. The semiconductor device of claim 14, wherein the upper portion of the at least one of the channel pad and the string select channel pad overlaps the gate electrodes in a vertical direction perpendicular to an upper surface of the substrate.

17. The semiconductor device of claim 14, wherein the channel pad includes an expanded portion extending in the horizontal direction on the gate dielectric layer.

18. The semiconductor device of claim 17, wherein the string select channel pad has a width smaller than a width of the channel pad.

19. A semiconductor device, comprising:
   a substrate;
   a stack structure on the substrate, the stack structure including interlayer insulating layers and gate electrodes alternately stacked on the substrate;
   a channel structure penetrating the stack structure, the channel structure including a channel layer, a gate dielectric layer between the channel layer and the gate electrodes, and a channel pad facing and contacting the channel layer;
   a first insulating layer on the stack structure, the first insulating layer covering an upper portion of the channel structure;
   a second insulating layer on the first insulating layer, the second insulating layer covering the channel pad of the channel structure;
   an upper stack structure on the second insulating layer, the upper stack structure including upper interlayer insulating layers and upper gate electrodes alternately stacked on the second insulating layer; and
   a string select channel structure penetrating the upper stack structure and contacting the channel structure, a lower portion of the string select channel structure having a width smaller than a width of an upper portion of the channel structure,
   wherein the channel pad includes an expanded portion extending in a horizontal direction on the gate dielectric layer.

20. The semiconductor device of claim 19, the expanded portion of the channel pad has a side surface not aligned with a side surface of the channel layer, and
   the channel pad overlaps the gate electrodes in a vertical direction perpendicular to an upper surface of the substrate.

* * * * *